United States Patent
Takano

(10) Patent No.: US 8,257,013 B2
(45) Date of Patent: Sep. 4, 2012

(54) SUBSTRATE TREATMENT APPARATUS

(75) Inventor: Satoshi Takano, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 1023 days.

(21) Appl. No.: 11/662,198

(22) PCT Filed: Nov. 18, 2005

(86) PCT No.: PCT/JP2005/021618
§ 371 (c)(1),
(2), (4) Date: May 9, 2007

(87) PCT Pub. No.: WO2006/057319
PCT Pub. Date: Jun. 1, 2006

(65) Prior Publication Data
US 2008/0019809 A1    Jan. 24, 2008

(30) Foreign Application Priority Data
Nov. 24, 2004    (JP) ................................. 2004-338400

(51) Int. Cl.
*B65H 1/00*          (2006.01)
(52) U.S. Cl. ......... 414/805; 414/939; 414/217; 414/411
(58) Field of Classification Search .................. 414/217, 414/411, 805, 939
See application file for complete search history.

(56) References Cited

U.S. PATENT DOCUMENTS

| | | | | |
|---|---|---|---|---|
| 5,820,679 A | * | 10/1998 | Yokoyama et al. | ............ 118/719 |
| 2003/0202792 A1 | * | 10/2003 | Goshi | ............................ 396/564 |

FOREIGN PATENT DOCUMENTS

| | | |
|---|---|---|
| JP | 62-207866 | 9/1987 |
| JP | 6-89934 | 3/1994 |
| JP | 10-41216 | 2/1998 |

OTHER PUBLICATIONS

Notification of Reasons for Refusal (with English translation) dated Apr. 27, 2010 in corresponding Japanese Patent Application No. 2006-547839.

* cited by examiner

*Primary Examiner* — Saul Rodriguez
*Assistant Examiner* — Willie Berry, Jr.
(74) *Attorney, Agent, or Firm* — Wenderoth, Lind & Ponack, L.L.P.

(57) ABSTRACT

The present invention provides a substrate treatment apparatus which sets substrate loading intervals to treatment chambers to a fixed value and prevents the occurrence of stagnancy of substrates in the treatment chambers. The substrate treatment apparatus includes a substrate conveyance chamber 5 which has a substrate conveyance device 11, a plurality of treatment chambers 6 to 9 in which a treatment time of at least one treatment chamber differs from treatment times of other treatment chambers and the respective treatment chambers are communicated with the conveyance chamber, and a control part 12 which controls a conveyance operation of the substrate conveyance device by setting treatment schedules of the substrates. In sequentially treating a plurality of substrates by the treatment chambers based on the preset same treatment schedule, the control part, using a time corresponding to a sum of the treatment time of the treatment chamber having the longest treatment time out of the treatment chambers predetermined during the treatment schedule and conveyance times before and after the treatment time with respect to the treatment chamber as a reference substrate loading interval, sets the substrate loading interval of respective substrates to the firstly loaded treatment chamber.

7 Claims, 13 Drawing Sheets

(a) List of definition of event flow

| No. | Event | Time(sec) | |
|---|---|---|---|
| 1 | P1 | 90 | Indicate treatment step performed in first treatment chamber |
| 2 | P2 | 140 | Indicate treatment step performed in second treatment chamber |
| 3 | P3 | 100 | Indicate treatment step performed in third treatment chamber |
| 4 | P4 | 115 | Indicate treatment step performed in fourth treatment chamber |
| 5 | T1~T5 | 20 | Indicate respective conveyance steps between treatment chambers or load-locking chambers. In the explanation of this paragraph, all conveyance times are set equal for the sake of convenience, however, when conveyance times are different from each other between respective treatment chambers, conveyance times may be defined with respect to respective treatment chambers. |

(b) Relationship between substrate treatment flow and name of events

| T1 | P1 | T2 | P2 | T3 | P3 | T4 | P4 | T5 |
|---|---|---|---|---|---|---|---|---|

Fig.2

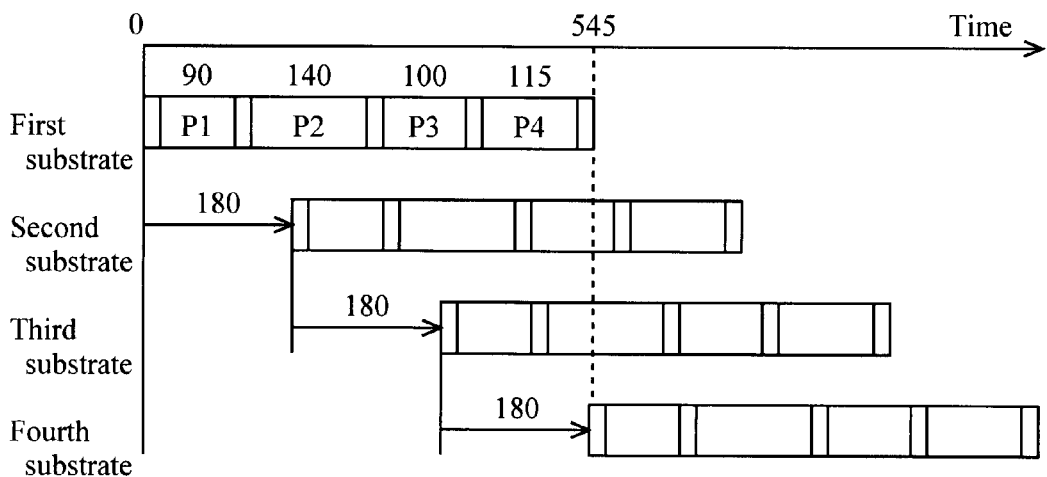

Fig.3

Start/end times of respective events

| Event | First substrate | | Second substrate | | Third substrate | | Fourth substrate | |
|---|---|---|---|---|---|---|---|---|
| | Start | End | Start | End | Start | End | Start | End |
| T1 | 0 | 20 | 180 | 200 | 360 | 380 | 540 | 560 |
| P1 | 20 | 110 | 200 | 290 | 380 | 470 | 560 | 650 |
| T2 | 110 | 130 | 290 | 310 | 470 | 490 | 650 | 670 |
| P2 | 130 | 270 | 310 | 450 | 490 | 630 | 670 | 810 |
| T3 | 270 | 290 | 450 | 470 | 630 | 650 | 810 | 830 |
| P3 | 290 | 390 | 470 | 570 | 650 | 750 | 830 | 930 |
| T4 | 390 | 410 | 570 | 590 | 750 | 770 | 930 | 950 |
| P4 | 410 | 525 | 590 | 705 | 770 | 885 | 950 | 1065 |
| T5 | 525 | 545 | 705 | 725 | 885 | 905 | 1065 | 1085 |

Fig.4

Result of interference checks of conveyance events

| Event | | Start | End | Interference |
|---|---|---|---|---|
| First substrate | T1 | 0 | 20 | O |
| First substrate | T2 | 110 | 130 | O |
| Second substrate | T1 | 180 | 200 | O |
| First substrate | T3 | 270 | 290 | O |
| Second substrate | T2 | 290 | 310 | O |
| Third substrate | T1 | 360 | 380 | O |
| First substrate | T4 | 390 | 410 | O |
| Second substrate | T3 | 450 | 470 | O |
| Third substrate | T2 | 470 | 490 | O |
| First substrate | T5 | 525 | 545 | × |
| Fourth substrate | T1 | 540 | 560 | — |

O:Interference not present
×:Interference present

Fig.5

Results of interference checks of conveyance when loading interval is set to 181sec

| Event | | Start | End | Interference |
|---|---|---|---|---|
| First substrate | T1 | 0 | 20 | O |
| First substrate | T2 | 110 | 130 | O |
| Second substrate | T1 | 181 | 201 | O |
| First substrate | T3 | 270 | 290 | O |
| Second substrate | T2 | 291 | 311 | O |
| Third substrate | T1 | 362 | 382 | O |
| First substrate | T4 | 390 | 410 | O |
| Second substrate | T3 | 451 | 471 | O |
| Third substrate | T2 | 472 | 492 | O |
| First substrate | T5 | 525 | 545 | × |
| Fourth substrate | T1 | 543 | 563 | — |

Results of interference checks of conveyance when loading interval is set to 182sec

| Event | | Start | End | Interference |
|---|---|---|---|---|
| First substrate | T1 | 0 | 20 | O |
| First substrate | T2 | 110 | 130 | O |
| Second substrate | T1 | 182 | 202 | O |
| First substrate | T3 | 270 | 290 | O |
| Second substrate | T2 | 292 | 312 | O |
| Third substrate | T1 | 364 | 384 | O |
| First substrate | T4 | 390 | 410 | O |
| Second substrate | T3 | 452 | 472 | O |
| Third substrate | T2 | 474 | 494 | O |
| First substrate | T5 | 525 | 545 | — |

(a) Free flow method

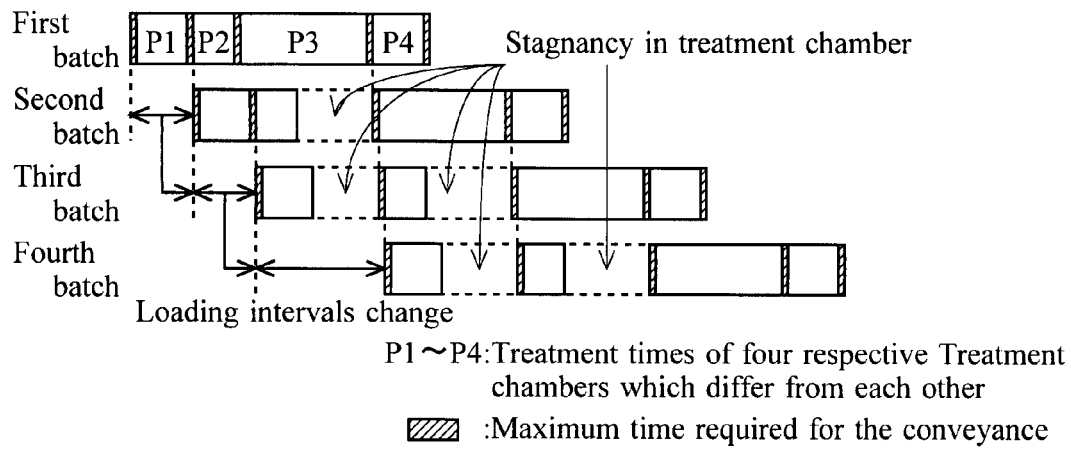

P1~P4: Treatment times of four respective Treatment chambers which differ from each other ▨ : Maximum time required for the conveyance (b) Fixed tact method

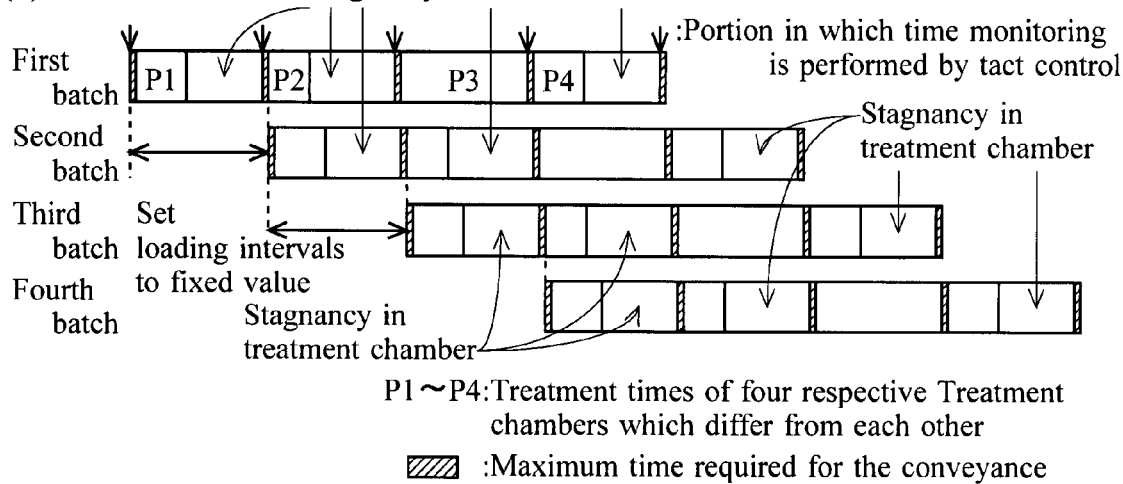

P1~P4: Treatment times of four respective Treatment chambers which differ from each other ▨ : Maximum time required for the conveyance Loading interval = (substrate loading time + maximum treatment time + substrate unloading time)

Fig.17

SUBSTRATE TREATMENT APPARATUS

TECHNICAL FIELD

The present invention relates to a substrate treatment apparatus which treats substrates, and more particularly to a substrate treatment apparatus which fixes loading intervals of the substrates to treatment chambers and prevents the generation of stagnancy of the substrates in the treatment chambers.

BACKGROUND ART

For example, a substrate treatment apparatus such as a semiconductor manufacturing apparatus which applies predetermined treatments to a semiconductor substrate (wafer) and an LCD manufacturing apparatus which applies predetermined treatments to an LCD (Liquid Crystal Display)-use glass substrate includes a plurality of treatment chambers therein, and the film forming treatment is applied to the substrate in each treatment chamber. Further, the substrate is transferred between the respective treatment chambers using a transfer machine.

One example of general steps for treating the substrate using a substrate treatment apparatus which has the constitution shown in FIG. 1 is explained in conjunction with FIG. 16. Here, as respective treatment furnaces (respective treatment furnaces 6 to 9), for example, furnaces for a heat treatment process are used. To be more specific, a hot wall furnace, a lamp furnace, a cold wall furnace adopting a resistive heating plate system and the like are adopted as the furnaces.

FIG. 16(a) shows one example of a substrate transfer flow when ultra-thin stacked films are formed on a single substrate to be treated through four treatment chambers 6 to 9, and FIG. 16(b) which shows one example of a treatment history of the substrate is shown as an event timing chart. In FIG. 16(a) and FIG. 16(b), the treatments indicated by same numerals (1) to (13) correspond to each other.

Hereinafter, the respective treatments (1) to (13) of the substrate treatment flow are explained in order.

(1) In a step of the loading treatment (atmospheric-pressure atmosphere conveyance), the substrates to be treated disposed in the inside of a carrier station 1a are conveyed to a first load-locking chamber 4 sheet by sheet by an atmospheric-pressure transfer machine 2. In this embodiment, in the course of the transfer of the substrate, the center position correction and the rotational-direction position correction of the substrate are performed via a substrate position correction unit 3 thus enhancing the reproduction of the conveyance position of the substrate to the first load-locking chamber 4.

(2) In a step of the load-locking chamber vacuum evacuation treatment, the vacuum evacuation for preventing an intrusion of air into a conveyance chamber 5 and the N2 atmosphere substitution are performed. The pressure adjustment is performed by supplying an inert gas such as an N2 gas to the transfer chamber 5 after performing the arrived vacuum evacuation corresponding to a holding pressure zone (1.0E-8 to 5.0E4 Pa) of the conveyance chamber 5.

(3) In a step of the first substrate conveyance treatment, using a vacuum atmosphere transfer machine 11 of the conveyance chamber 5, the substrate is conveyed to the first treatment chamber 6 from the first load-locking chamber 4.

(4) In a step of the first processing treatment, the treatment in the first treatment chamber 6 is performed. Here, in the respective treatment chambers 6 to 9, the film forming treatments such as the formation of an ultra-thin film and the heat treatment are applied to the substrate. Further, the treatment times in the respective treatment chambers 6 to 9 usually differ from each other for respective treatment chambers 6 to 9 in many cases.

(5) In a step of the second substrate conveyance treatment, using the vacuum atmosphere transfer machine 11 of the conveyance chamber 5, the substrate is conveyed to the second treatment chamber 7 from the first treatment chamber 6.

(6) In a step of the second processing treatment, the treatment in the second treatment chamber 7 is performed.

(7) In a step of the third substrate conveyance treatment, using the vacuum atmosphere transfer machine 11 of the conveyance chamber 5, the substrate is conveyed to the third treatment chamber 8 from the second treatment chamber 7.

(8) In a step of the third processing treatment, the treatment in the third treatment chamber 8 is performed.

(9) In a step of the fourth substrate conveyance treatment, using the vacuum atmosphere transfer machine 11 of the conveyance chamber 5, the substrate is conveyed to the fourth treatment chamber 9 from the third treatment chamber 8.

(10) In a step of the fourth processing treatment, the treatment at the fourth treatment chamber 9 is performed.

(11) In a step of the fifth substrate conveyance treatment, using the vacuum atmosphere transfer machine 11 of the conveyance chamber 5, the substrate is conveyed to the first load-locking chamber 4 from the fourth treatment chamber 9.

(12) In a step of the treatment for restoring the atmospheric-pressure in the load-locking chamber and the substrate cooling treatment, the restoration of atmospheric-pressure for returning the substrate after the treatment to the atmospheric-pressure atmosphere is performed. These steps also simultaneously perform a cooling event of the high-temperature substrate after the treatment.

(13) In a step of the unload treatment, the substrate after the treatment is conveyed to the carrier station 1a from the first load-locking chamber 4.

Here, the above-mentioned conveyance steps (3), (5), (7), (9) and (11) describe the operations in which a valve element mechanism (GV: gate valve) which isolates the treatment chambers 6 to 9 (also including the load-locking chambers 4, 5) which constitute the substrate transfer sources from the conveyance chamber 5 is opened, the predetermined substrate is held using the transfer machine 11, the substrate is transferred to one of the treatment chambers 6 to 9 which constitutes the substrate transfer destination, and the GV of the treatment chamber which constitutes the substrate transfer destination is closed. Further, the time of this conveyance step also includes, depending on a case, a preliminary operation time of the transfer machine 11 which is necessary for getting access to the substrate at the substrate transfer source from a state that the previous transfer operation of the substrate is finished. In this specification, the conveyance time implies such a time.

Further, the above-mentioned process treatment steps (4), (6), (8) and (10) indicate steps immediately after the GV is closed due to the transfer operation and immediately before the GV for the substrate is opened, wherein in the steps, a predetermined sequence is executed so as to apply the ultra-thin film forming treatment and the heat treatment to the substrate.

A timing chart shown in FIG. 16(b) expresses treatment histories of respective substrates as dimensional events with respect to the above-mentioned steps (1) to (13).

To continuously and effectively apply the same treatment to a plurality of substrates, it is necessary to arrange the above-mentioned events such that the same events in the above-mentioned timing chart are not overlapped to each other.

Here, an example of a related art is explained.

As one example, in "a substrate conveyance control method and a substrate product manufacturing method", out of values of a group of treatment chambers each of which is obtained by dividing a total time consisting of a time required for substrate treatment in a treatment chamber and a time required for conveyance treatment of the substrate to the treatment chamber by the number of treatment chambers in a group of treatment chambers, a time which is equal to or more than a maximum value is set as a tact time, and the substrate which constitutes an object to be treated is loaded into the substrate treatment apparatus at a time interval in accordance with the tact time (for example, see patent document 1). Here, although the substrate loading time is fixed in this technique, the stagnancy of substrate occurs in the treatment chamber.

Patent document 1:

U.S. Pat. No. 3,193,904

SUMMARY OF THE INVENTION

With respect to the conventional substrate treatment apparatus, in the steps for continuously forming stacked films on the substrate using a plurality of treatment chambers 6 to 9, for example, when the treatment times of the respective treatment chambers 6 to 9 differ from each other, the fluctuation of the loading interval of the substrate to the treatment chambers 6 to 9 or the stagnancy of the substrate in the treatment chambers 6 to 9 occurs. Accordingly, there arises a drawback such as the deterioration of the reproducibility of the substrate performance attributed to the fluctuation of the loading interval of the substrate to the treatment chambers 6 to 9 and a drawback of an extra heat history attributed to the stagnancy of the substrate in the treatment chambers 6 to 9, and also the difficulty in taking the correlation with the single film performance. Accordingly, even when the treatment times differ from each other for respective treatment chambers 6 to 9, there has been a demand for the development of a substrate conveyance control method which fixes the loading interval of the substrate into the treatment chambers 6 to 9 and prevents the stagnancy of the substrate in the treatment chambers 6 to 9.

The invention has been made to overcome such conventional drawbacks, and it is an object of the invention to provide a substrate treatment apparatus which fixes a loading interval of substrates to the respective treatment chambers and conveys the substrate to prevent a conveyance standby time at the time of unloading the substrate also when the treatment times of the respective treatment chambers differ from each other whereby heat histories between the substrates are made uniform so as not to generate an extra thermal load to the respective substrates thus enhancing the reproducibility and the reliability of the substrate performance.

To achieve the above-mentioned object, the substrate treatment apparatus according to the invention has following constitutions.

That is, the substrate treatment apparatus includes a substrate conveyance chamber which has a substrate conveyance device, a plurality of treatment chambers in which a treatment time of at least one treatment chamber differs from treatment times of other treatment chambers and the respective treatment chambers are communicated with the conveyance chamber, and a control part which controls a conveyance operation of the substrate conveyance device by setting treatment schedules of the substrates. Then, a plurality of substrates is sequentially treated by the treatment chambers based on the preset same treatment schedule.

Further, the control part, using a time corresponding to a sum of the treatment time of the treatment chamber having the longest treatment time out of the treatment chambers predetermined during the treatment schedule and conveyance times before and after the treatment time with respect to the treatment chamber as a reference substrate loading interval, sets the substrate loading interval of respective substrates to the firstly loaded treatment chamber.

Due to such a constitution, for example, a substrate treatment apparatus can fix loading intervals of substrates to the respective treatment chambers and conveys the substrate to prevent a conveyance standby time at the time of unloading the substrate also when the treatment times of the respective treatment times differ from each other whereby heat histories between the substrates are made uniform so as not to generate an extra thermal load to the respective substrates thus enhancing the reproducibility and the reliability of the substrate performance.

Here, as the substrate, for example, a silicon wafer or a glass substrate for manufacturing a semiconductor device or an LCD device can be used.

Further, the number of the plurality of treatment chambers may be set to various numbers.

Further, the treatment times may be set to various modes.

Further, as the treatment schedule of the substrate, for example, with respect to a period from the loading of one substrate into the first treatment chamber to the unloading of the substrate from the final treatment chamber, a schedule of a series of treatments constituted of the conveyance treatment by the substrate conveyance device and the treatment in the respective treatment chambers is used.

When such a treatment schedule for every substrate is equal with respect to a plurality of substrates, when an interval of loading times (loading interval) of the respective substrates is set, the conveyance schedule of each substrate and the whole treatment schedule with respect to the plurality of substrates are predetermined.

Here, various modes may be used as the treatment schedule of the substrate.

Further, as the time corresponding to a sum of the treatment time of the treatment chamber having the longest treatment time out of the treatment chambers predetermined during the treatment schedule and conveyance times before and after the treatment time with respect to the treatment chamber, a time corresponding to a result obtained by adding the treatment time of the treatment chamber having the longest treatment time, the conveyance time for loading the substrate into the treatment chamber before the treatment, and the conveyance time for unloading the substrate from the treatment chamber after the treatment is used.

Further, as a technique which sets the loading intervals of the respective substrates using the reference substrate loading interval, for example, it is possible to use a technique which is performed as follows. It is determined whether the reference substrate loading interval is proper or not. If the reference substrate loading interval is not proper, the reference substrate loading interval is updated and the determination whether the reference substrate loading interval is proper or not is repeatedly executed thus eventually finding and setting the proper substrate loading interval.

In the substrate treatment apparatus according to the invention, the control part sets the loading intervals of the substrates to be loaded to the treatment chamber in which the substrates are loaded firstly without changing the contents of the treatment schedule per se to the predetermined substrate.

Since the contents of the treatment schedule per se to the substrate are not changed, it is possible to apply the treatment with the same contents of the treatment schedule to all substrates thus facilitating the management and grasping of the treatment schedule.

The substrate treatment apparatus according to the invention, as one constitutional example, adopts the following constitution.

That is, with respect to the control part, in setting the loading intervals of the respective substrates to the treatment chamber to which the substrates are firstly loaded, first of all, the reference substrate loading interval is used as an initial value of the substrate loading interval. Then, the processing (processing 1) which develops the treatment schedule of the respective substrates with time is executed. Processing (processing 2) which determines an interference state of the substrate conveyance device among the plurality of developed treatment schedules is executed. When the interference of the substrate conveyance devices occurs, processing (processing 3) which sets an interval which is obtained by adding a predetermined interval to the currently set substrate loading interval as a new substrate loading interval is executed. Then, these processing 1, 2 and 3 are repeatedly executed until the interference of the substrate conveyance device is eliminated.

Accordingly, by repeating the determination of the interference state by updating the substrate loading interval until the interference is eliminated using the reference substrate loading interval as the initial value, it is possible to find and set the proper substrate loading interval.

Here, as the processing which develops the treatment schedules of the respective substrates with time, for example, the processing which develops the treatment schedules such that the treatment schedule of the respective substrates are arranged in parallel while delaying times corresponding to the substrate loading intervals of the respective substrates is used. Here, this processing is not always executed as an image using a graph or a chart but may be executed using only numerical values.

Further, as the interference state of the substrate conveyance device, for example, the invention uses a mode in which when the conveyance treatment of one substrate and the conveyance treatment of another substrate are wholly or partially overlapped to each other with time, it is considered that the interference occurs (the interference is present), while the interference does not occur in other cases (no interference is present).

Further, as the predetermined intervals for updating the substrate loading intervals, for example, various values may be used corresponding to the use state of the device, the required accuracy or the like.

The invention may be also realized as a method which performs the above-mentioned various processing.

As an example, according to a manufacturing method of a semiconductor device of the invention, in a substrate treatment apparatus which includes a substrate conveyance chamber which has a substrate conveyance device, a plurality of treatment chambers in which a treatment time of at least one treatment chamber differs from of treatment times of other treatment chambers and the respective treatment chambers are communicated with the conveyance chamber, and a control part which controls a conveyance operation of the substrate conveyance device by setting treatment schedules of the substrates, and treats a plurality of substrates sequentially by the treatment chambers based on the preset same treatment schedule, the semiconductor device is manufactured in accordance with the following constitution.

That is, the control part, using a time corresponding to a sum of the treatment time of the treatment chamber having the longest treatment time out of the treatment chambers predetermined during the treatment schedule and conveyance times before and after the treatment time with respect to the treatment chamber as a reference substrate loading interval, sets the substrate loading interval of respective substrates to the firstly loaded treatment chamber.

BRIEF DESCRIPTION OF THE DRAWINGS

FIG. 2 is a view for explaining one example of a calculation of a reference substrate loading interval;

FIG. 3 is a chart showing one example of a substrate treatment flow in a developed form;

FIG. 4 is a table showing one example of start times and end times of respective events;

FIG. 5 is a table showing one example of a result of an interference check of a conveyance event;

FIG. 17(a) and FIG. 17(b) are charts showing one example of an event timing chart when a plurality of substrates is treated.

DETAILED DESCRIPTION OF THE INVENTION

Hereinafter, an embodiment according to the invention is explained in conjunction with drawings.

Here, this embodiment is explained by taking a substrate treatment apparatus which treats a semiconductor substrate and a manufacturing method of a semiconductor device as an example. However, for example, the constitution and the manner of operation similar to the constitution and the manner of operation of this embodiment are applicable to a substrate treatment apparatus which treats an LCD substrate or the like.

Figure 1:
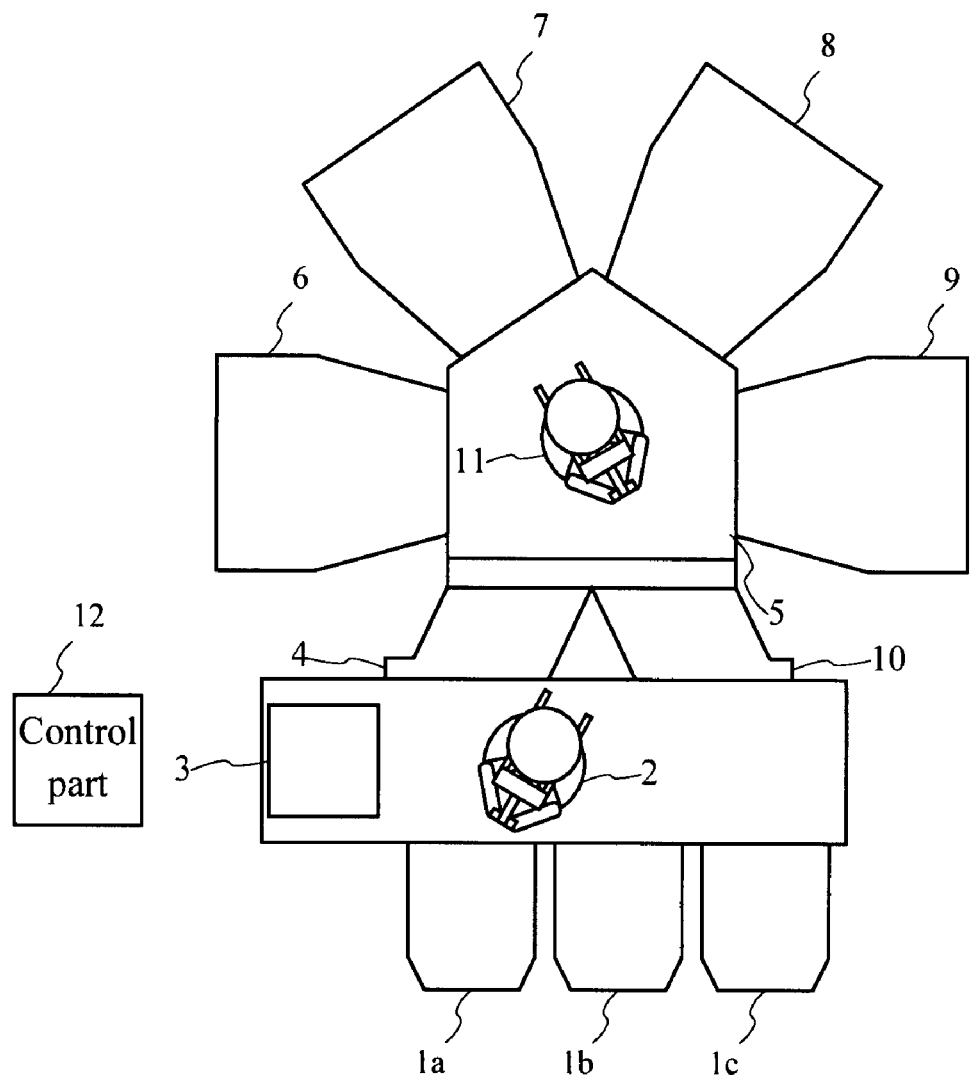
FIG. 1 is a view showing a constitutional example of a substrate treatment apparatus according to one embodiment of the invention.

In FIG. 1, a constitutional example of a substrate treatment apparatus according to one embodiment of the invention is shown.

The substrate treatment apparatus of this embodiment is constituted of carrier stations (load ports: LP) 1a, 1b and 1c, an atmospheric-pressure atmosphere transfer machine (LH) 2, a substrate position correction unit (aligner: AU) 3, a first load-locking chamber (LM1) 4, a conveyance chamber 5 on which a vacuum atmosphere transfer machine (TH) 11 is mounted, a first treatment chamber (PM1) 6, a second treatment chamber (PM2) 7, a third treatment chamber (PM3) 8, a fourth treatment chamber (PM4) 9, a second load-locking chamber (LM2) 10, and a control part 12.

Here, the substrate treatment apparatus includes, as the constitutional features, the conveyance chamber 5 on which the transfer machine 11 for performing a substrate conveyance is mounted and which is arranged at a center of the substrate treatment apparatus, two or more treatment chambers (in this embodiment, four) 6 to 9 which are arranged close to a periphery of the conveyance chamber 5 to apply a predetermined treatment to the substrates, and the load-locking chambers 4, 10 for preventing an intrusion of air component into the treatment chambers 6 to 9 by performing an atmosphere substitution using an inert gas such as an N2 gas when an exchange of the substrate is performed between the conveyance chamber 5 and the outside. Further, the substrate treatment apparatus provides the carrier stations 1a, 1b and 1c for temporarily arranging the carrier in which the substrate is stored during performing the treatment, the transfer machine 2 which transfers the single substrate from the carrier on the carrier stations 1a, 1b and 1c to the load-locking chambers 4, 10 when necessary, and the substrate position correction unit 3 which arranges the substrate in the carrier into the load-locking chambers 4, 10 with high accuracy. Further, the control part 12 is provided to the substrate treatment apparatus.

Further, the respective treatment chambers 6 to 9 are, for example, constituted as a film forming chamber, a buffer chamber or the like.

Further, the control part 12 is, in this embodiment, configured to execute a predetermined program using hardware resources such as a ROM (Read Only Memory), a RAM (Random Access Memory) and a CPU (Central Processing Unit).

Next, an example of the manner of operation of this embodiment which is performed by a semiconductor treatment device is explained.

In this embodiment, in a continuous conveyance control in which the respective treatment times at the plurality of treatment chambers 6 to 9 are different from each other, by using the treatment times of the respective treatment chambers 6 to 9 and the times of the respective conveyance events as parameters, a preferable substrate loading interval is induced based on a relationship between the above-mentioned times and hence, it is possible to realize a conveyance control having a fixed substrate loading interval to the respective treatment chambers 6 to 9 without generating the stagnancy of the substrate in the treatment chambers 6 to 9.

Here, in this embodiment, the number of treatment chambers is indicated by symbol n, and treatment events and treatment times at the respective treatment chambers P1 to Pn are indicated by symbols P1 to Pn. In this embodiment, the treatments are performed in order of a treatment chamber P1, a treatment chamber P2, . . . , and a treatment chamber Pn. The treatment times at the respective treatment chambers P1 to Pn are used to calculate a total treatment time per one substrate and a start time or an end time of the conveyance event.

Further, in this embodiment, a maximum time out of the treatment times P1 to Pn is indicated by a symbol Pmax. The maximum time Pmax is used to calculate a reference substrate loading interval by being added with conveyance times before and after the corresponding event.

Further, in this embodiment, the number of conveyance per one substrate is indicated by symbol m, the conveyance events between the respective treatment chambers and the conveyance times of the respective conveyance events are indicated by symbols T1 to Tm. The respective conveyance times T1 to Tm are used to calculate a total treatment time per one substrate and a start time or an end time of the conveyance event.

Hereinafter, with respect to a calculation reference of the substrate loading interval, (1) calculation processing of the reference loading interval, (2) interference check (interference inspection) processing of the conveyance event, and (3) increment processing of the substrate loading interval are explained in order.

(1) In main processing of the calculation processing of the reference loading interval, a substrate loading interval D which becomes the reference for performing the interference check of the conveyance event is calculated. In this embodiment, when the time of the longest treatment step in the treatment chambers 6 to 9 is set to Pmax, and the substrate conveyance times before and after Pmax are respectively set to Ta and Tb, the substrate loading interval D which becomes the reference is decided as (Ta+Pmax+Tb). That is, the substrate loading interval D is calculated by a formula D=(Ta+Pmax+Tb).

As a specific example, in FIG. 2(a), the treatment events at the respective treatment chambers 6 to 9 and the respective conveyance events are defined. Further, in FIG. 2(b), the relationship between a flow of the substrate treatment and names of the respective events is shown.

As shown in the drawing, in this embodiment, assume the treatment step performed in the first treatment chamber 6 as the event P1, the treatment step performed in the second treatment chamber 7 as the event P2, the treatment step performed in the third treatment chamber 8 as the event P3, and the treatment step performed in the fourth treatment chamber 9 as the event P4. Further, in this embodiment, assume the conveyance step from the load-locking chamber 4 to the first treatment chamber 6 as the event T1, the conveyance step from the first treatment chamber 6 to the second treatment chamber 7 as the event T2, the conveyance step from the second treatment chamber 7 to the third treatment chamber 8 as the event T3, the conveyance step from the third treatment chamber 8 to the fourth treatment chamber 9 as the event T4, and the conveyance step from the fourth treatment chamber 9 to the load-locking chamber 4 as the event T5.

Further, in this embodiment, by setting a time necessary for the event P1 to 90(sec), a time necessary for the event P2 to 140 (sec), a time necessary for the event P3 to 100 (sec), a time necessary for the event P4 to 115(sec), and times necessary for the events T1 to T5 respectively to 20(sec), final substrate loading intervals are calculated later.

Here, in this embodiment, the explanation is made with respect to a case in which the conveyance times necessary for the respective events T1 to T5 for the conveyance of the substrate are set equal to each other. However, as another constitutional example, when the conveyance times are different from each other among the respective treatment chambers 6 to 9, the conveyance times are defined with respect to the respective conveyance events.

In this embodiment, among the treatment events P1 to P4, the treatment event P2 in the second treatment chamber r7 requires the largest time and hence, the Pmax becomes P2 and, the conveyance times Ta and Tb before and after the Pmax become the T2 and T3. Accordingly, a calculation result of the reference substrate loading interval D becomes D=T2+P2+T3=20+140+20=180[sec].

(2) The Interference Check Processing of the Conveyance Event

In this processing, an interference condition of the conveyance event is checked by developing the substrate treatment flow for every reference substrate loading interval D which is calculated in the above-mentioned manner.

The number of substrate which develops the substrate treatment flow (the number of developed substrates) is calculated as [division value of (total treatment time per one substrate)/(substrate loading interval)+1].

In this embodiment, the total treatment time per one substrate is a sum of the treatment times of all events P1 to P4 and T1 to T5 and hence, the total treatment time becomes 545 [sec], and the reference substrate loading interval becomes 180 [sec]. Accordingly, the number of developed substrates is calculated as 4 (=[division value of (545/180)+1]=3+1).

FIG. 3 shows a substrate treatment flow in a developed form.

In the example shown in FIG. 3, with respect to each substrate from the first substrate to the fourth substrate, the same substrate treatment flow is arranged in a state that the substrate treatment flow is gradually shifted by 180 [sec]

Next, by reference to the substrate treatment flow shown in FIG. 3, with respect to the each substrate, the start times (start time) and the end times (finish time) of the respective events P1 to P4, T1 to T5 are calculated. Here, in this example, the calculation is performed by using the treatment start time of the first substrate as the reference (=0[sec]).

FIG. 4 shows the start times and the end times of the respective events P1 to P4, T1 to T5 corresponding to the respective substrates which are calculated in the above-mentioned manner.

Further, based on these start times and end times, all conveyance events which are performed until a last event (conveyance event T5) of the first substrate is finished are extracted from all conveyance events T1 to T5. In this embodiment, the conveyance events which are performed until 545[sec] are extracted and, to be more specific, all conveyance events T1 to T5 with respect to the first substrate, the conveyance events T1 to T3 with respect to the second substrate, the conveyance events T1, T2 with respect to the third substrate, and the conveyance event T1 with respect to the fourth substrate are extracted.

Next, the above-mentioned extracted conveyance events are excerpted and the excerpted conveyance events are arranged in order that the event occurs earlier. Further, the interference with time between one event and another event which is performed immediately after one event is checked from the first initial event. To be more specific, by comparing the end time of the preceding event and the start time of the succeeding event, when the start time of the succeeding event is larger than the end time of the preceding event (that is, when the succeeding event is started after the preceding event is finished), it is determined that the interference of the conveyance events is not generated, while when the start time of the succeeding event is smaller than the end time of the preceding event (that is, when the succeeding event is started before the preceding event is finished), it is determined that the interference of the conveyance event is generated.

FIG. 5 shows an example of a result of the interference check of the conveyance events.

In the examples shown in FIG. 5, the above-mentioned extracted events are arranged in descending order that the start time of the event comes earlier, and the end time of the upper conveyance event and the start time of the lower conveyance event are compared with each other to determine whether the event interference is not generated (indicated by O in FIG. 5) or the event interference is generated (indicated by x in FIG. 5).

In this manner, the interference conditions of the conveyance events are checked one by one in order of advancing of the events, and when it is determined that the interference is generated in neither one of the above-mentioned extracted conveyance events, it is determined that a substrate loading interval in this case is appropriate and the substrate loading interval is adopted, and a routine work of the calculation treatment of the substrate loading interval is finished.

On the other hand, even when only one event interference is generated, it is determined that the substrate loading interval in this case is not appropriate and the treatment advances to (3) the increment treatment of the substrate loading interval.

In this embodiment, as shown in FIG. 5, the conveyance event T5 of the first substrate and the conveyance event T1 of the fourth substrate interfere with each other.

(3) The Increment Treatment of the Substrate Loading Interval

In this treatment, when the event interference is generated with respect to the reference substrate loading interval, an arbitrary time is added to the substrate loading interval. Further, each time the substrate loading interval is reset, the above-mentioned (2) interference check treatment of the conveyance event is repeatedly executed.

Here, in this embodiment, although the time which is added to the substrate loading interval is explained in order of 1[sec], the time is not particularly limited. In an actual operation, it is preferable that the time is decided based on the resolution of the control system such as the conveyance and the degree of influence of the substrate characteristic on the event time dependency. As a result of such decision, for example, the time may be set in order of [msec].

In this embodiment, first of all, by setting 181[sec] which is a result obtained by adding 1[sec] to the reference substrate loading interval 180[sec] as a new substrate loading interval, the interference check is performed. Here, the number of developed substrates when the substrate treatment flow is developed becomes 4 (=[division value of (545/181)+1]=3+1)).

Figures 6, 7:
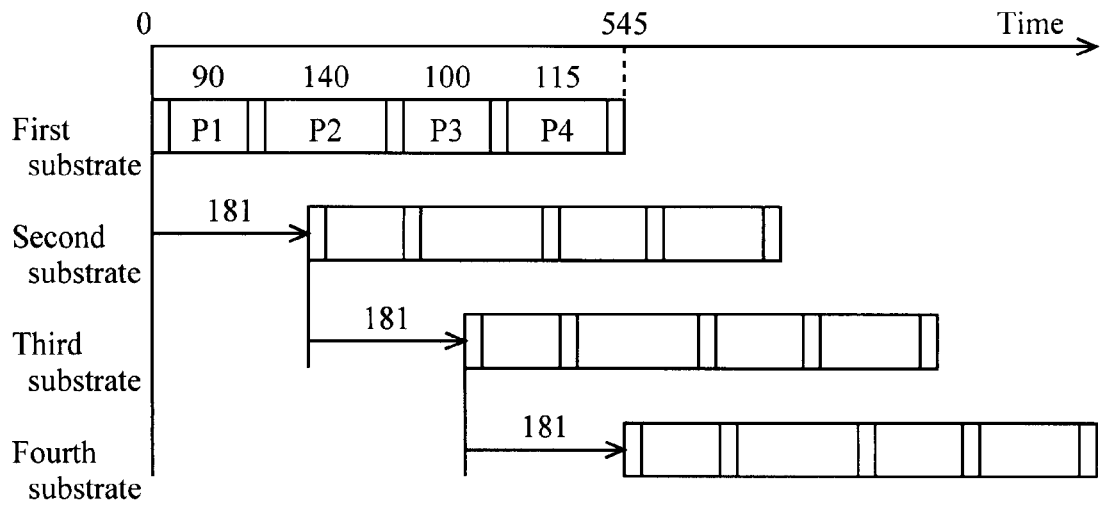
FIG. 6 is a chart showing one example of a substrate treatment flow in a developed form.
FIG. 7 is a table showing one example of a result of an interference check of a conveyance event.

FIG. 6 shows a developed example of the substrate treatment flow when the substrate loading interval is set to 181 [sec].

Further, FIG. 7 shows the interference check result of the conveyance events in this case.

Also in this case, the conveyance event T5 of the first substrate and the conveyance event T1 of the fourth substrate interfere with each other and hence, the interference check is executed by incrementing the substrate loading interval again.

That is, by setting 182[sec] which is a result obtained by adding 1[sec] to the currently-set substrate loading interval 181[sec] as a new substrate loading interval, the interference check is performed. Here, the number of developed substrates when the substrate treatment flow is developed becomes 3 (=[division value of (545/182)+1]=2+1)).

Figures 8, 9:
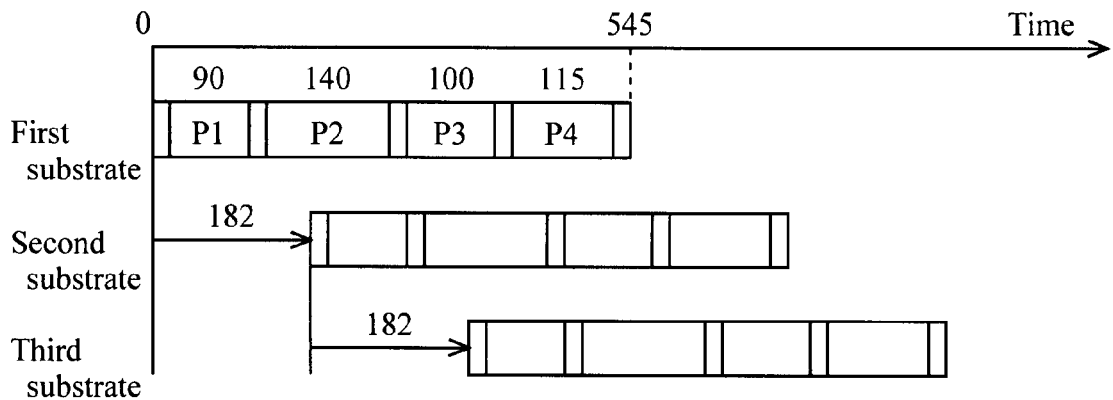
FIG. 8 is a chart showing one example of a substrate treatment flow in a developed form.
FIG. 9 is a table showing one example of a result of an interference check of a conveyance event.

FIG. 8 shows a developed example of a substrate treatment flow when the substrate loading interval is set to 182 [sec]. Further, FIG. 9 shows the interference check result of the conveyance events in this case.

In this case, the interference is not generated in any one of the conveyance events and hence, the currently set 182[sec] is determined and adopted as the substrate loading interval.

Figure 10:
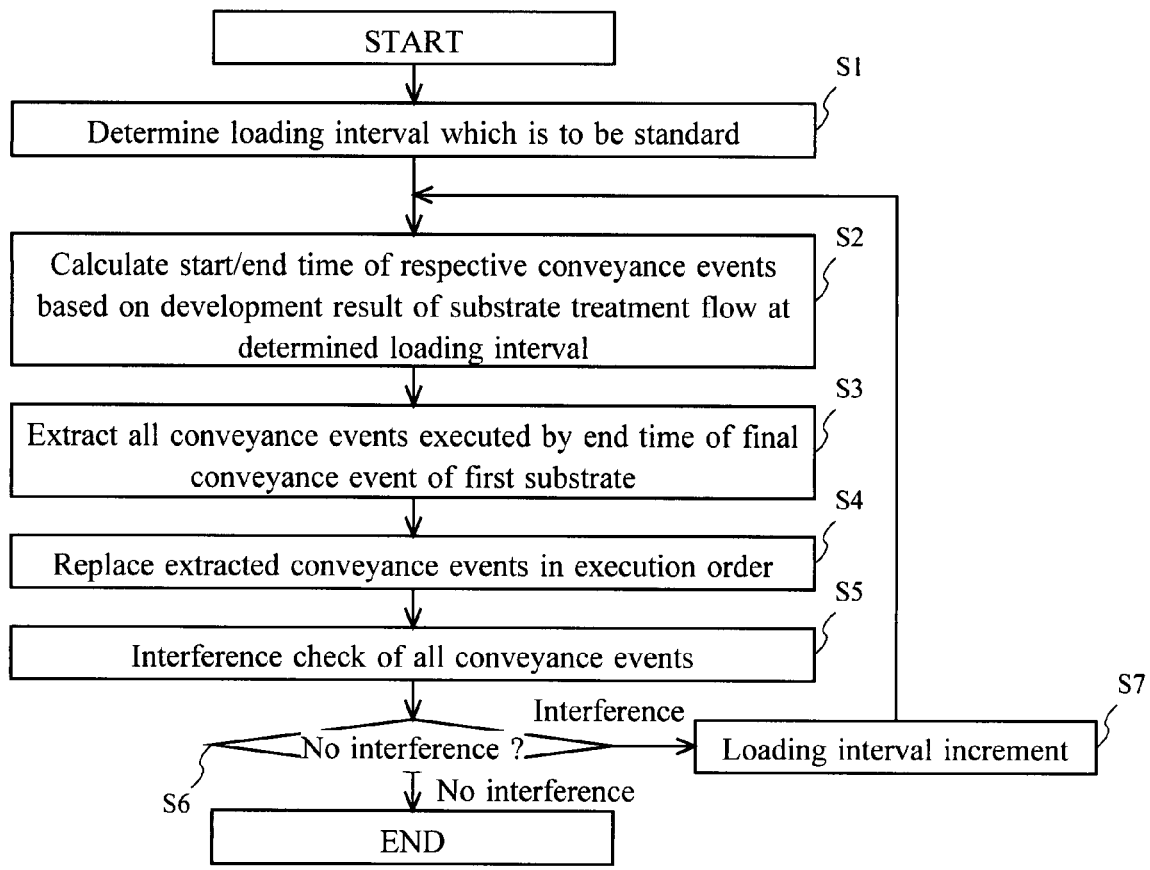
FIG. 10 is a flow chart showing one example of steps of a decision treatment of the substrate loading interval which is performed by the substrate treatment apparatus.

Next, in conjunction with FIG. 10, an example of a determining process flow of the substrate loading interval performed by the substrate treatment apparatus according to this embodiment is described. In this embodiment, the processing is executed by the control part 12.

The substrate treatment apparatus firstly decides the substrate loading interval which becomes the reference (step S1) and develops the substrate treatment flow at the decided substrate loading interval and calculates the start times and the end times of the respective conveyance event based on the result of the development (step S2).

The substrate treatment apparatus next extracts all conveyance events executed by the end time of the final conveyance event of the first substrate (step S3) and arranges the extracted conveyance events in order of execution (step S4).

Next, the substrate treatment apparatus checks the presence or non-presence of interference with respect to all arranged conveyance events (step S5) and if there is no interference at all (step S6), the substrate treatment apparatus decides to adopt the currently-set substrate loading interval, while there is any interference (step S6), the substrate treatment apparatus increases the substrate loading interval by applying an increment (step S7) and again executes processing including the developing processing and processing succeeding the developing processing in the substrate treatment flow (step S2 to step S7).

As mentioned above, in the substrate treatment apparatus according to this embodiment includes the conveyance chamber 5 for the substrate having the substrate conveyance device (the transfer machine in this embodiment) 11, the plurality of treatment chambers 6 to 9 in which the treatment time of at least one treatment chamber is different from the treatment times of other treatment chambers and which are respectively communicated with the conveyance chamber 5 of the substrate, and the control part 12 which sets the substrate treatment schedule and controls the conveyance operation of the substrate conveyance device 11, wherein the plurality of substrates are sequentially processed by the treatment chambers 6 to 9 based on the predetermined same treatment schedule, and performs the following treatment.

That is, the control part 12, in setting the loading intervals for loading the respective substrates firstly to the treatment chamber 6 based on the treatment schedule, assumes the time calculated based on the sum of the treatment time of the treatment chamber having the longest treatment time out of the treatment chambers 6 to 9 which is predetermined during the treatment schedule and conveyance times before and after the treatment time with respect to the treatment chamber as the shortest interval D of the substrate loading interval, and sets the schedule for conveying the plurality of substrates sequentially to the objective treatment chambers while setting the substrate loading interval D as the reference.

Further, the control part 12, in setting the conveyance schedule, sets the conveyance schedule without changing the content of the treatment schedule per se with respect to the preset substrate.

Further, in setting the loading interval of the substrate, the control part 12 develops the treatment schedules of the respective substrates sequential with time while using the interval D as the reference (processing 1), determines the interference state of the substrate conveyance device 11 among the plurality of developed treatment schedules (processing 2), and sets the interval (D+d) obtained by adding the predetermined interval d to the above-mentioned interval D as a new substrate loading interval (processing 3) when the interference is generated, and at least the processing 1, 2 and 3 are repeatedly executed until the interference of the substrate conveyance device 11 is eliminated.

Further, a manufacturing method of the semiconductor device and the like can be realized by the present embodiment.

As a specific example, in the substrate treatment apparatus of this embodiment which adopts the constitution including the conveyance chamber 5 having one transfer machine 11 mounted thereon, two or more treatment chambers 6 to 9 which are provided for heat treatment and ultra-thin film forming, and the load-locking chambers 4 and 10 which are provided for atmospheric substitution between the atmospheric pressure and the conveyance chamber 5, by optimizing the substrate loading interval such that the interference of the same event occurs neither during the times of the treatment events in the treatment chambers 6 to 9 nor during the times of the conveyance events, it is possible to perform the conveyance control which can set the substrate loading intervals to the respective chambers 6 to 9 to a fixed value and, at the same time, can prevent the generation of an extra substrate transfer standby time in the treatment chambers 6 to 9.

Accordingly, in the substrate treatment apparatus of this embodiment, by optimizing the loading intervals between the substrates, it is possible to realize the conveyance control which generates no stagnancy of substrate and can fix the constant loading interval between the substrates. Here, in this embodiment, the interference check of the conveyance events in the respective treatment chambers 6 to 9 is performed based on the calculation of the reference loading interval on the premise of performing one treatment in the plurality of treatment chambers 6 to 9 respectively. However, as another constitutional example, when a plurality of treatments is performed in each one of the treatment chamber 6 to 9, the interference check of the treatment events in the treatment chambers 6 to 9 is performed in the same manner as the conveyance events thus deciding the substrate loading interval at the timing that all the results of the interference check exhibit no interference.

In the substrate treatment apparatus according to this embodiment, in the continuous conveyance control in which the respective treatment times in the plurality of treatment chambers 6 to 9 differ from each other, it is possible to realize the conveyance control which can eliminate the stagnancy of the substrate in the treatment chambers 6 to 9 and can set the substrate loading intervals to the respective treatment chambers 6 to 9 to a fixed value and hence, heat histories between the substrates can be made uniform so as not to generate extra thermal loads to the respective substrates thus enhancing the reproducibility and the reliability of the substrate performance.

Further, in case the predetermined treatment schedule or the predetermined content of the recipe with respect to the substrate is modified (that is, in case the stagnancy or the delay is inserted), there may arise a possibility that the condition deviates from the initial condition in the respective treatment chambers 6 to 9 or that the reproducibility of the firstly loaded substrate and the secondly loaded substrate cannot be obtained. However, in this embodiment, without modifying the predetermined treatment schedule or the predetermined content of the recipe with respect to the substrate (that is, without changing the predetermined treatment schedule or the predetermined content of the recipe with respect to the substrate), the loading interval of the substrate can be set to a fixed value thus preventing the stagnancy in the inside of the chambers (the stagnancy in the inside of the treatment chambers 6 to 9).

Further, various improvements may be made without departing from the gist of the invention.

Next, one example of the treatment furnace which can be used in the respective treatment chambers (PM) 6 to 9 which are provided to the substrate treatment apparatus of the invention is shown.

Figure 11:
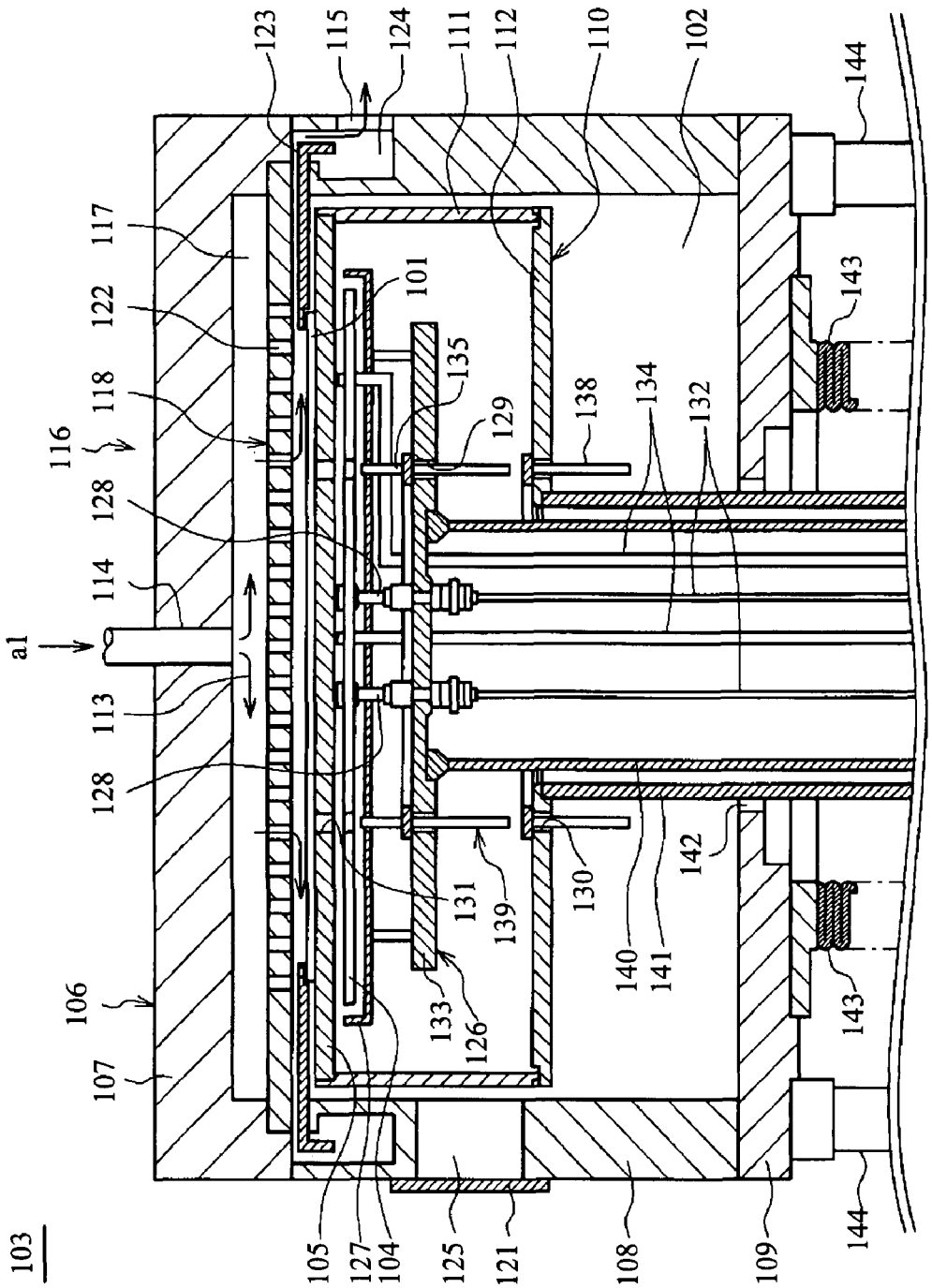
FIG. 11 is a view showing a schematic cross section of an upper portion of a treatment furnace according to one embodiment of the invention.
Figure 12:
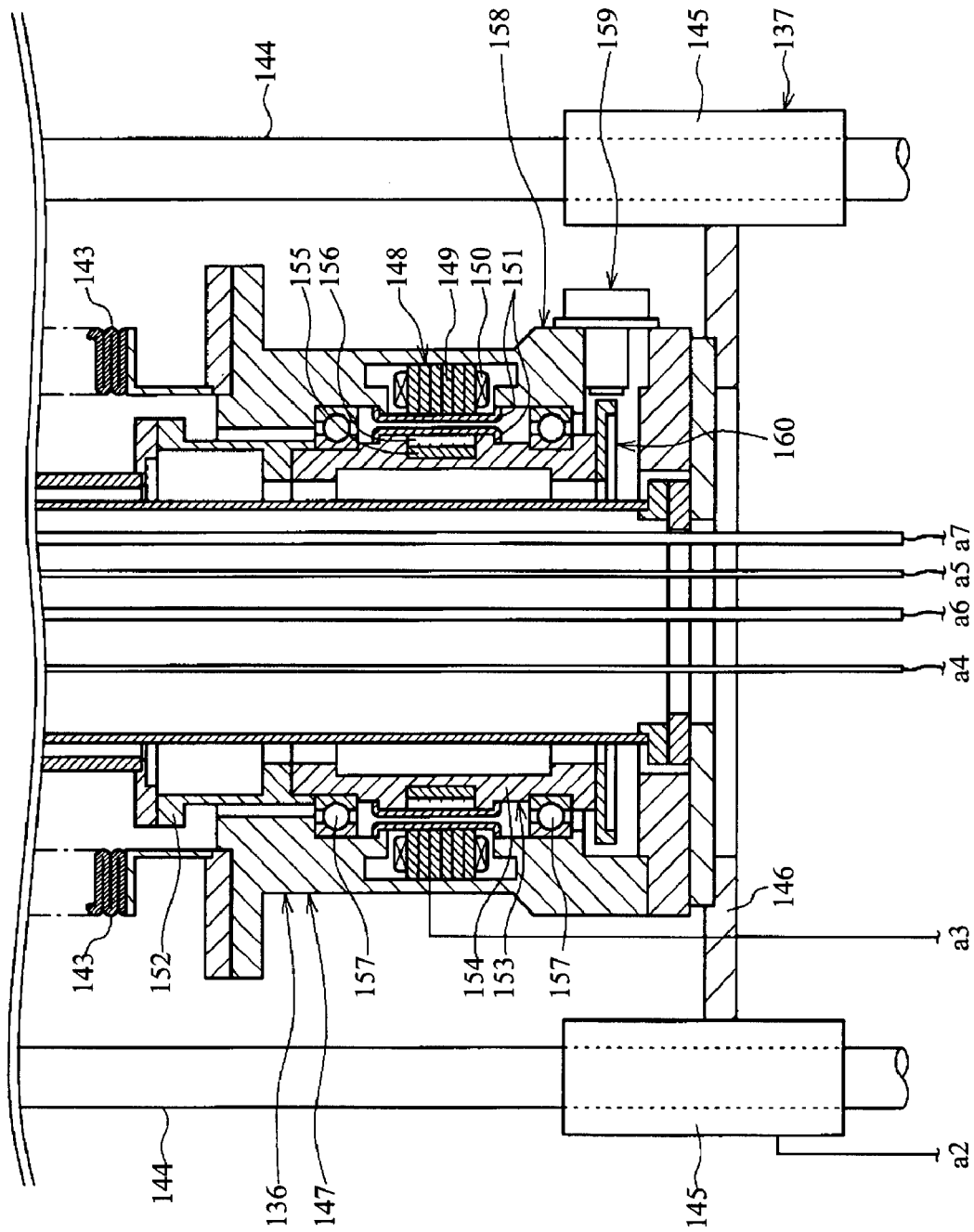
FIG. 12 is a view showing a schematic cross section of a lower portion of a treatment furnace according to one embodiment of the invention.
Figure 13:
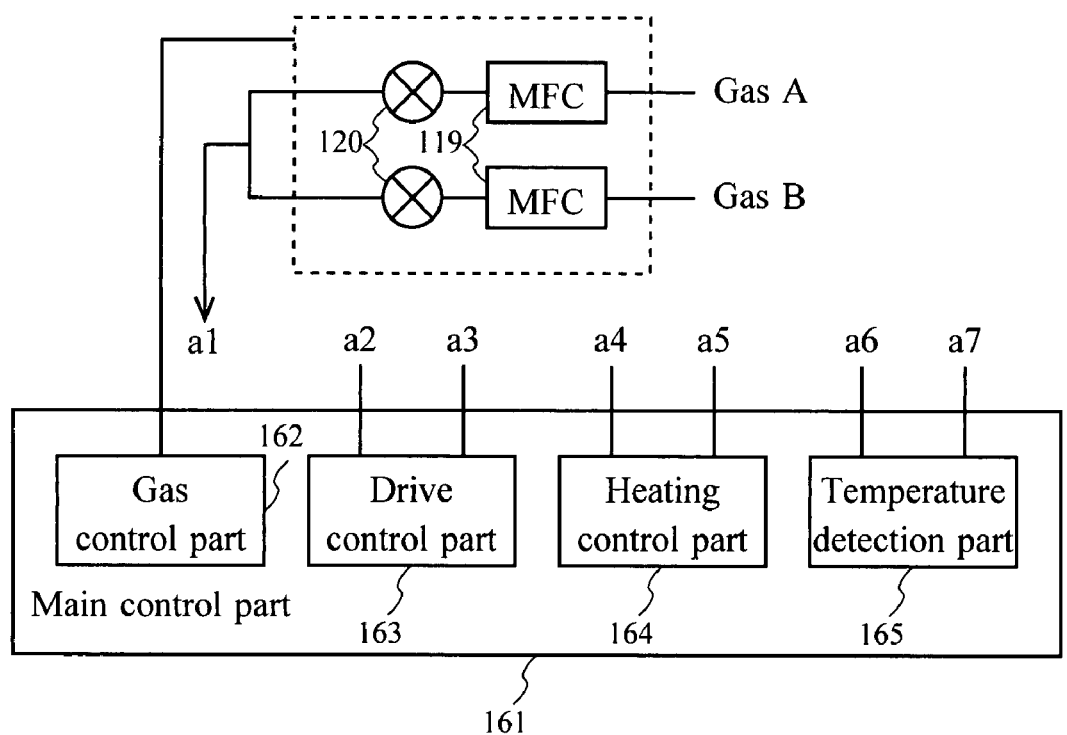
FIG. 13 is a view showing a control system of the treatment furnace according to one embodiment of the invention.

FIGS. 11, 12 and 13 show schematic cross-sections of the treatment furnace 103 and one example of a control system thereof.

Here, to facilitate the understanding of the drawing, an upper part of the treatment furnace 103 is shown in FIG. 11, while a lower part of the treatment furnace 103 is shown in FIG. 12. These drawings are combined together to form a view showing the whole structure of the treatment furnace 103.

FIG. 13 shows a control system of the treatment furnace 103 and lines indicated by symbols a1 to a7 are connected with lines which are indicated by the same symbols a1 to a7 in different drawings. That is, the line a1 indicated in FIG. 13 is connected with the line a1 indicated in FIG. 11, while the lines a2 to a7 indicated in FIG. 13 are connected to the lines a2 to a7 indicated in FIG. 12 respectively.

As shown in the drawings, the treatment furnace 103 of this example is constituted as a single-wafer CVD furnace (single-wafer cold-wall type CVD furnace) and includes a chamber 106 which defines a treatment chamber 102 which treats a wafer (semiconductor wafer) 101 constituting a substrate to be treated. The chamber 106 is formed in a cylindrical shape by combining an upper cap 104, a cylindrical cup 108 and a lower cap 109 in a state that upper and lower end surfaces of the chamber 106 are respectively closed.

In an intermediate portion of a cylinder wall of the cylindrical cup 108 of the chamber 106, a wafer load/unload opening 125 which can be opened or closed by a gate valve 121 is opened laterally in the horizontal direction. The wafer load/unload opening 125 is formed to allow a wafer transfer device not shown in FIG. 11 to load the wafer 101 which constitutes the substrate to be treated to the treatment chamber 102 or to unload the wafer 101 from the treatment chamber 102. That is, the wafer 101 is loaded or unloaded to or from the treatment chamber 102 through the wafer load/unload opening 125 in a state that the wafer 101 is mechanically supported from below by the wafer transfer device.

In an upper portion of a wall surface which faces the wafer load/unload opening 125 of the cylindrical cup 108 in an opposed manner, an exhaust port 115 which is connected to an exhaust apparatus (not shown in the drawing) which is formed of a pump and the like, is formed in a state that the exhaust port 115 is communicated with the treatment chamber 102. A gas inside the treatment chamber 102 is exhausted by the exhaust apparatus.

Further, on an upper portion of the cylindrical cup 108, an exhaust buffer space 124 which is communicated with the exhaust port 115 is formed annularly and the exhaust buffer space 124 acts to uniformly exhaust the gas in a front surface of the wafer 101 as well as in a cover plate 123.

The cover plate 123 extends over a portion of a susceptor (substrate holding means) 105 such that the cover plate 123 covers an edge portion of the wafer 101, wherein the cover plate 123 is used to control a CVD film which is formed on the edge portion of the wafer 101.

Into the upper cap 107 of the chamber 106, a shower head 116 which supplies a treatment gas is integrally incorporated. That is, a gas supply tube 114 is inserted into a ceiling wall of the upper cap 107, while a gas supply apparatus which is constituted of an open/close valve 120 which introduces the treatment gases A, B such as a raw material gas and a purge gas and a flow rate control apparatus (mass flow controller: MFC) 119 is connected to the respective gas supply tubes 114. To a lower surface of the upper cap 107, a shower plate (hereinafter referred to as a plate) 118 which is formed in a disk shape is fixed in the horizontal direction in a spaced-apart manner from the gas supply tube 114. In the whole surface of the plate 118, a plurality of gas blow-off ports (hereinafter referred to as blow-off ports) 122 is uniformly arranged and opened to allow the upper and lower spaces to communicate with each other.

A buffer chamber 117 is formed of an inner space which is defined by an inner surface of the upper cap 107 and an upper surface of the plate 118, while the buffer chamber 117 diffuses uniformly a treatment gas 113 which is introduced into the gas supply tube 114 as a whole and blows off the treatment gas 113 uniformly from the respective blow-off ports 122 in a shower-like manner.

In the center of the lower cap 109 of the chamber 106, a through hole 142 is opened in a round-shape, wherein along a center line of the through hole 142, a support shaft 140 which is formed in a cylindrical shape is inserted into the treatment chamber 102 from below. The support shaft 140 is elevated or lowered by an elevating mechanism (elevating means) 137 which uses a pneumatic cylinder apparatus or the like is used.

To an upper end of the support shaft 140, a heating unit 126 is fixed concentrically to be fixed in the horizontal direction, while the heating unit 126 is elevated or lowered by the support shaft 140. That is, the heating unit 126 includes a support plate 135 which is formed in a disk shape. The support plate 135 is concentrically fixed to an upper end opening of the support shaft 140. On an upper surface of the support plate 133, a plurality of electrodes 128 which also functions as support columns is mounted in an erected manner. Between the upper ends of the electrodes 128, a heater (a heating means) 104 which is formed in a disk shape and is divided into a plurality of regions to be controlled is extended and fixed. An electric line 132 for the electrodes 128 passes through a hollow portion of the support shaft 140.

Further, below the heater 104, a reflection plate 127 is fixedly mounted on the support plate 135. The reflection plate 127 enhances the heating efficiency by reflecting heat emitted from the heater 104 to the susceptor 105 side.

Further, a radiation thermometer 134 which constitutes a temperature detection means is introduced from a lower end of the support shaft 140. The radiation thermometer 134 is arranged in a state that an end of the radiation thermometer 134 is arranged with a predetermined gap with respect to a back surface of the susceptor 105. The radiation thermometer 134 is constituted of a combination of a rod made of quartz and an optical fiber. The radiation thermometer 134 detects a radiation light emitted from the back surface (for example, the back surface corresponding to a divided region of the heater 104) of the susceptor 105, thus the radiation thermometer 134 is used to calculate a temperature of the back surface of the susceptor 105. Based on a result of the calculation, the degree of heating by the heater 104 is controlled. Here, it is also possible, for example, to calculate a temperature of the wafer 101 based on the pre-acquired relationship of temperatures between the wafer 101 and the susceptor 105.

Outside the support shaft 140 in the through hole 142 formed in the lower cap 109, a rotary shaft 141 which is formed in a cylindrical shape having diameter larger than a diameter of the support shaft 140 is arranged concentrically and is inserted into the treatment chamber 102 from below. The rotary shaft 141 is elevated or lowered together with the support shaft 140 by the elevating mechanism 137 which uses the pneumatic cylinder apparatus or the like. On an upper end of the rotary shaft 141, a rotary drum 110 is arranged concentrically and is fixed in the horizontal direction, wherein the rotary drum 110 is rotated by the rotary shaft 141. That is, the rotary drum 110 includes a rotary plate 112 formed of a donut-shaped planar plate and a rotary cylinder 111 formed in a cylinder shape. An inner edge portion of the rotary plate 112 is fixed to an upper end opening of the rotary shaft 141, while the rotary cylinder 111 is fixed concentrically to an outer edge portion of the upper surface of the rotary plate 112. The susceptor 105 which is made of silicon carbide, aluminum nitride or the like is formed in a disc shape and covers an upper end of the rotary cylinder 111 of the rotary drum 110 so as to close an upper end opening of the rotary cylinder 111.

As shown in the drawing, the rotary drum 110 includes a wafer elevating apparatus 139. The wafer elevating apparatus 139 is configured such that on two elevating rings which are formed in a round ring shape, projecting pins (a substrate projecting means) 135, 138 are formed in a projecting manner. A lower elevating ring (hereinafter referred to as a rotation-side ring) is concentrically arranged on the rotary plate 112 of the rotary drum 110 with the support shaft 140. On the lower surface of the rotation-side ring, a plurality (three for the present embodiment) of projecting pins (hereinafter referred to as a rotation-side pin) 138 is arranged at regular intervals in the circumference direction in a projecting manner in the vertically downward direction. The respective rotation-side pins 138 are arranged on the rotary plate 112 on a line concentric with the rotary cylinder 111 and the rotation-side pins 138 are respectively fit into respective guide holes 129 which are opened in the vertical direction in a slidable manner. Lengths of the respective rotation-side pins 138 are set equal to each other such that the rotation-side pins 138 can horizontally push up the rotation-side ring and at the same time, the lengths of the respective rotation-side pins 138 are set such that the rotation-side pins correspond with a push-up amount from an upper surface of the susceptor of the wafer. Lower ends of the respective face a bottom surface of the treatment chamber 102, that is, in a state that rotation-side pins 138 can be seated on and removed from upper surface of the lower cap 109.

On the support plate 133 of the heating unit 126, another elevating ring (hereinafter referred to as a heater-side pin) which is formed in a round ring shape is arranged concentrically with the support shaft 140. On the lower surface of the heater-side ring, a plurality (three in the present embodiment) of projecting pins (hereinafter referred to as heater-side pins) 135 is arranged at an equal interval in the circumference direction and is mounted in a projecting manner in the vertically downward direction. The heater-side pins 135 are respectively slidably fit into the respective guide holes 129 which are arranged and opened in the support plate 133 on a line concentric with the support shaft 140 in the vertical direction.

Lengths of the heater-side pins 135 are set to be equal to each other such that the heater-side pins 135 can horizontally push up the heater-side ring and at the same time, lower ends of the heater-side pins 135 face the upper surface of the rotation-side ring in an opposed manner with an appropriate air gap therebetween. That is, the heater-side pins 135 are configured not to interfere with the rotation-side ring when the rotation-drum 110 is rotated.

Further, on the upper surface of the heater-side ring, a plurality (three for the present embodiment) of projecting pins (hereinafter referred to as a projecting portion) 135 is arranged at an equal interval in the circumference direction in a projecting manner in the vertically downward direction. The upper end of the projecting portion 135 faces a through hole 131 of the heater 104 and the susceptor 105 in an opposed manner. Lengths of the projecting portion 135 are set equal to each other such that the projecting portion 135 passes through the through hole 131 of the heater 104 from below and makes the wafer 101 which is placed on the susceptor 105 horizontally float from the susceptor 105. The length of the projecting portion 135 is set such that the upper end of the projecting portion 135 does not project from the upper surface of the heater 104 when the heater-side ring is seated on the support plate 133. That is, the projecting portions 135 do not interfere with the susceptor 105 when the rotary drum 110 is rotated and also the projecting portions 135 do not prevent the heating of the heater 104.

As shown in the drawing, the chamber 106 is horizontally supported with a plurality of support columns 144. The support columns 144 are respectively fitted in elevating blocks 145 in an elevatable manner. Between the elevating blocks 145, an elevating base 146 which is elevated or lowered by an elevating drive device (not shown in the drawing) which is constituted of a pneumatic cylinder or the like is extended. A susceptor rotation apparatus is mounted on the elevating base 146. Bellows 143 are interposed between the susceptor rotation apparatus and the chamber 106 so as to hermetically seal the outside of the rotary shaft 141.

A brushless DC motor is used for a susceptor rotation mechanism (a rotational means) 136 which is mounted on the elevating base 146. An output shaft (a motor shaft) is formed in a hollow shaft to constitute the rotary shaft 141. The susceptor rotation mechanism 136 includes a housing 147, wherein the housing 147 is mounted on the elevating base 146 in a state that the housing 147 is directed upwardly in the vertical direction. A stator 148 which is constituted of an electro-magnet (coil) is fixed to an inner surface of the housing 147. That is, the stator 148 is constituted of a coil wire (an enamel-coated copper line) 150 which is wound around a core 149. With respect to the coil wire 150, a lead line not shown in the drawings passes through a through hole (not shown in the drawing) which is opened in a side wall of the housing 147 to be electrically connected, while the stator 148 is supplied with electricity from a driver of the brushless DC motor with a lead line connected with the coil wire 150, thus a rotary magnetic field is generated.

A rotor 153 is concentrically arranged inside the stator 148 with an air gap therebetween, and the rotor 153 is rotatably supported on the housing 147 by way of upper and lower ball bearings 157. That is, the rotor 153 includes a cylindrical body 154, a core 155 and a plurality of permanent magnets 156, wherein a rotary shaft 141 is fixed to the body 154 such that the rotary shaft 141 is integrally rotated with the body 154 by way of a bracket 152. The core 155 is fitted on and fixed to the body 154, and a plurality of permanent magnets 156 are fixed to an outer periphery of the core 155 at an equal interval in the circumferential direction. A plurality of magnetic poles which are arranged annularly are formed by the core 155 and the plurality of permanent magnets 156, wherein when a rotary magnetic field which the stator 148 forms traverses the plurality of magnetic poles, that is, the magnetic fields of the permanent magnets 156, the rotor 148 is rotated.

The upper and lower ball bearings 157 are respectively mounted on upper and lower end portions of the body 154 of the rotor 153, while a gap is suitably defined in the upper and lower ball bearings 157 to absorb the thermal expansion of the body 154. The gap of the ball bearing 157 is set to 5 to 50 μm for suppressing a play to a minimum value while absorbing the thermal expansion of the body 154. Here, the gap of the ball bearing 157 implies a gap which is generated, when balls are displaced to either one side of an outer lace or an inner lace, on a side opposite to the displaced side.

On opposedly facing surfaces of the stator 148 and the rotor 153, covers 151 which constitute outer and inner surrounding members and form a duplicate cylindrical wall are arranged in an opposed manner, and the covers 151 are respectively fixed to an inner peripheral surface of the housing 147 and an outer peripheral surface of the body 154, and a predetermined air gap is defined between the respective covers 151. The covers 151 are made of stainless steel which is a non-magnetic material, and are respectively formed into a cylindrical shape having an extremely thin cylindrical wall thickness. Further, the covers 151 have the whole circumference of upper and lower open ends of cylinders thereof surely and uniformly fixed to the housing 147 and the body 154 by electron beam welding. The covers 151 are formed with an extremely small thickness using stainless steel which is the non-magnetic material and hence, it is possible to prevent not only the lowering of the motor efficiency by preventing the diffusion of magnetic fluxes but also the corrosion of coil wires 150 of the stator 148 and the permanent magnets 156 of the rotor 153. Further, it is also possible to surely prevent the contamination of the inside of the treatment chamber 102 attributed to the coil wire 150 or the like. Since the covers 151 can surround the stator 148 in a hermetically sealed state, it is possible to completely insulate the stator 148 from the inside of the treatment chamber 102 which forms a vacuum atmosphere.

Further, a magnetic rotary encoder 158 is mounted on the susceptor rotation apparatus. That is, the magnetic rotary encoder 158 includes a ring to be detected 160 as an object to be detected which is made of a magnetic material. The ring to be detected 160 made of a magnetic material of iron or the like is formed in a circular-ring shape. On an outer periphery of the ring to be detected 160, a large number of teeth is circularly arranged as portions to be detected.

At a portion of the housing 147 opposite to the ring to be detected 160, a magnetic sensor 159 for detecting respective teeth which constitute portions to be detected of the ring to be detected 160 is mounted. A clearance (sensor gap) between the distal end surface of the magnetic sensor 159 and the outer periphery of the ring to be detected 160 is set to 0.06 mm to 0.17 mm. The magnetic sensor 159 is constituted so as to respectively detect changes of magnetic flux along with rotation of the ring to be detected 160 using a magnetic resistant element at the position to which the magnetic sensor 159 and the ring to be detected 160 face each other. Detection results of the magnetic sensor 159 are transmitted to a drive control part of a brushless DC motor, that is, the susceptor rotation mechanism 136 and are used for the position recognition of the susceptor 105 and, at the same time, are used for the control of a rotary amount of the susceptor 105.

Here, the treatment furnace 103 includes a main control part 161 which is constituted of a gas control part 162, a drive control part 163, a heating control part 164, a temperature detection part 165 and the like. The gas control part 162 is connected to the MFC119 and the open/close valve 120 and controls a gas flow rate and a gas supply. The drive control part 163 is connected to the susceptor rotation mechanism 136 and the elevating block 145 and controls the susceptor rotation mechanism 136 and the elevation block 145. The heating control part 164 is connected to the heater 104 via the wiring 132 and controls the degree of heating works by the heater 104. The temperature detection part 165 is connected to the radiation thermometer 134 and detects the temperature of the susceptor 105 and is used for the heating control of the heater 104 in cooperation with the heating control part 164.

Next, by explaining the manner of operation of the treatment furnace 103 having the above-mentioned constitution, a film forming step in a manufacturing method of a semiconductor device which is one embodiment of the invention is explained.

In loading or unloading the wafer 101, the rotary drum 110 and the heating unit 126 are moved downwardly to a lower-limit position by the rotary shaft 141 and the support shaft 140. In this manner, the lower end of the rotation-side pin 138 of the wafer elevating apparatus 139 is brought into contact with the bottom surface of the treatment chamber 102, that is, the upper surface of the lower-side cap 109 and hence, the rotation-side ring is relatively moved upwardly with respect to the rotary drum 110 and the heating unit 126. The rotation-side ring which is moved upwardly elevates the heater-side ring by pushing up the heater-side pin 135. When the heater-side ring is elevated, three projecting portions 135 which are mounted on the heater-side ring in an erected manner are inserted into the through hole 131 of the heater 104 and the susceptor 105 and make the wafer 101 which is placed on the upper surface of the susceptor 105 float from the susceptor 105 by supporting the wafer 101 from below.

In a state that the wafer elevating apparatus 139 makes the wafer 101 float from the upper surface of the susceptor 105, a space is formed below of the wafer 101, that is, an insert space is formed between the lower surface of the wafer 101 and the upper surface of the susceptor 105. Accordingly, tweezers which constitute a substrate holding plate mounted on a wafer transfer machine not shown in FIG. 11 are inserted into the insert space of the wafer 101 from the wafer load/unload opening 125. The tweezers which are inserted into the space below the wafer 101 receives the wafer 101 by moving upwardly to transfer the wafer 101. The tweezers which receive the wafer 101 are retracted from the wafer load/unload opening 125 and unloads the wafer 101 from the treatment chamber 102. Further, the wafer transfer machine which unloads the wafer 101 by using the tweezers transfers the wafer 101 to a predetermined storing place in an empty wafer cassette or the like outside the treatment chamber 102.

Next, the wafer transfer machine receives the wafer 101 which is subjected to the next film forming treatment from a predetermined storing place such as the loaded wafer cassette using the tweezers and unloads the wafer 101 on the treatment chamber 102 via the wafer load/unload opening 125. The tweezers transfer the wafer 101 to a position at which the center of the wafer 101 agrees with the center of the susceptor 105 above the susceptor 105. After the tweezers transfer the wafer 101 to the predetermined position, the tweezers are slightly lowered to transfer the wafer 101 on the susceptor 105. The tweezers which transfer the wafer 101 to the wafer elevating apparatus 139 retract from the treatment chamber 102 via the wafer load/unload opening 125. When the tweezers retract from the treatment chamber 102, the wafer load/unload opening 125 is closed using the gate valve (gate valve) 121.

When the gate valve 121 is closed, the rotary drum 110 and the heating unit 126 are elevated relative to the treatment chamber 102 by the elevating base 146 by way of the rotary shaft 141 and the support shaft 140. Due to the elevation of the rotary drum 110 and the heating unit 126, the projecting pins 135, 138 relatively descend with respect to the rotary drum 110 and the heating unit 126 and, as shown in the drawing, the wafer 101 is completely transferred on the susceptor 105. The rotary shaft 141 and the support shaft 140 are stopped at a position at which heights of upper ends of the projecting pins 135 approximate a lower surface of the heater 104.

On the other hand, the gas in the treatment chamber 102 is exhausted using an exhaust apparatus (not shown in the drawing) which is connected to the exhaust port 115. Here, the vacuum atmosphere of the treatment chamber 102 and the outside atmospheric pressure atmosphere are completely isolated from each other by the bellows 143.

Next, the rotary drum 110 is rotated by the susceptor rotation mechanism 136 by way of the rotary shaft 141. That is, when the susceptor rotation mechanism 136 is driven, the rotary magnetic field of the stator 153 cuts the magnetic fields of a plurality of magnetic poles of the rotor 153 and hence, the rotor 153 is rotated whereby the rotary drum 110 is rotated by the rotary shaft 141 which is fixed to the rotor 153. Here, the rotational position of the rotor 153 is detected by the magnetic rotary encoder 158 which is mounted on the susceptor rotation mechanism 136 momentarily and the rotational position signal is transmitted to the drive control part 163, and the drive control part 163 controls the rotation speed or the like in response to the signal.

During a period in which the rotary drum 110 is rotated, the rotation-side pins 138 are separated from a bottom surface of the treatment chamber 102, and the heater-side pins 135 are separated from the rotation-side ring and hence, the rotation of the rotary drum 110 is not interrupted by the wafer elevating apparatus 139. Further, the heating unit 126 can maintain the stopping state. That is, the wafer elevating apparatus 139 assumes a state in which the rotation-side ring and the rotation-side pins 138 are rotated together with the rotary drum 110 and the heater-side ring and the heater-side pins 135 are stopped together with the heating unit 126.

At a point of time that the temperature of the wafer 101 is elevated to the treatment temperature and the exhaust quantity from the exhaust port 115 and the rotational operation of the rotary drum 110 are stabilized, as indicated by an arrow with a solid line in FIG. 11, the treatment gas 113 is introduced to the supply pipe 114. The treatment gas 113 which is introduced to the gas supply pipe 114 flows into the buffer chamber 117 which functions as a gas dispersion space and, at the same time, is radially dispersed outwardly in the radial direction and blows off like a shower toward the wafer 101 from the respective gas blow-off ports 122 of the shower plate 118 in approximately uniform flows respectively. The treatment gas 113 which is blown off like a shower from the blow-off ports 122 passes through a space above the cover plate 123 and is sucked into the exhaust port 115 via the exhaust buffer space 124 and is discharged.

Here, the wafer 101 on the susceptor 105 which is supported on the rotary drum 110 is rotated and hence, the treatment gas 113 which is blown off like a shower from the group of blow-off ports 122 is uniformly brought into contact with the whole surface of the wafer 101. The treatment gas 113 is uniformly brought into contact with the whole surface of the wafer 101 and hence, the film thickness distribution and the film quality distribution of the CVD film which is formed on the wafer 101 using the treatment gas 113 are made uniform over the whole surface of the wafer 101.

Further, the heating unit 126 is supported on the support shaft 140 thus assuming a non-rotatable state and hence, the temperature distribution of the wafer 101 which is heated by the heating unit 126 while being rotated by the rotary drum 110 is uniformly controlled over the whole surface. Since the temperature distribution of the wafer 101 is uniformly controlled over the whole surface, the distribution of film thickness and the distribution of film quality of a CVD film which is formed on the wafer 101 by a thermo-chemical reaction are uniformly controlled over the whole surface of the wafer 101.

Here, as an example, the treatment conditions for treating the substrate in the treatment furnace 103 of this embodiment are set such that in forming a phosphorous doped poly-Si film, the temperature of the wafer is set to 610° C., a kind of gas and a gas supply quantity are set such that a flow rate is 100 sccm when the kind of gas is SiH4 and the flow rate of 100 sccm when the kind of gas is 1% PH3/N2, and the treatment pressure is 36000 Pa. Here, 1% PH3/N2 is a mixed gas containing 1% of PH3 and 99% of N2.

When the pre-selected predetermined treatment time lapses, the operation of the susceptor rotary mechanism 136 is stopped. Here, a rotational position of the susceptor 105, that is, the rotor 153 is monitored momentarily by a magnetic rotary encoder 158 which is mounted on the susceptor rotary mechanism 136 and hence, the susceptor 105 is accurately stopped at the predetermined rotational position. That is, the projecting portion 135, the heater 104 and the insertion hole 131 of the susceptor 105 are aligned with each other with accuracy and favorable reproducibility.

When the operation of the susceptor rotary mechanism 136 is stopped, as mentioned previously, the rotary drum 110 and the heating unit 126 are lowered to the loading/unloading position by the elevating base 146 by way of the rotary shaft 141 and the support shaft 140. As mentioned previously, in the course of the lowering, the wafer 101 is floated above the susceptor 105 due to an action of the wafer elevating apparatus 139. Here, since the projecting portion 135, the heater 104 and the insertion hole 131 of the susceptor 105 are aligned with each other accurately and with good reproducibility, there exists no possibility of the occurrence of erroneous projection in which projecting portion 135 projects the susceptor 105 and the heater 104.

Thereafter, by repeating the above-mentioned operation, the film forming treatment for forming CVD films on the next wafer 101 is performed.

Next, a mode for carrying out the invention of the substrate treatment apparatus according to another embodiment is described.

Here, the constitution of the substrate treatment apparatus of this embodiment is substantially equal to the constitution of the substrate treatment apparatus shown in FIG. 1 and hence, the detailed explanation is omitted. Further, in the substrate treatment apparatus of this embodiment, the substrate loading interval for loading the substrate to the treatment chambers 6 to 9 is not fixed and the change of the substrate loading interval and hence, the change of the substrate loading interval is suppressed to a minimum value.

For example, conventionally, the excessive change of the substrate loading interval to the treatment chambers 6 to 9 or the stagnancy of the substrate in the treatment chambers 6 to 9 adversely influences the quality of the substrate sometimes. Accordingly, in the step in which stacked films are continuously formed on the substrate using a plurality of treatment chambers 6 to 9, there has been a demand for a substrate conveyance control method which can, even when the treatment times differ from each other for respective treatment chambers 6 to 9, set the substrate loading interval to the treatment chambers 6 to 9 to a fixed value as much as possible and, at the same time, can prevent the generation of stagnancy of the substrate in the treatment chambers 6 to 9.

The substrate treatment apparatus of this embodiment is developed for overcoming the above-mentioned conventional drawback, wherein the substrate treatment apparatus can suppress the irregularities of the substrate loading interval to the respective treatment chambers and can convey the substrate to prevent a conveyance standby time at the time of unloading the substrate whereby heat histories between the substrates are made uniform so as not to generate an extra thermal load to the respective substrates thus enhancing the reproducibility and the reliability of the substrate performance.

An example of the manner of operation performed by the semiconductor treatment device of this embodiment is explained.

In this embodiment, in the continuous transfer control in which respective treatment times of the plurality of treatment chambers 6 to 9 differ from each other, using the processing times of the respective treatment chambers 6 to 9 and times of respective conveyance events as parameters, an optimum substrate loading interval is induced based on the relationship among these parameters and hence, it is possible to realize the conveyance control which eliminates the stagnancy of the substrate in the treatment chambers 6 to 9 and can suppress the change of the substrate loading interval to the respective treatment chambers 6 to 9 to a minimum value.

Hereinafter, with respect to the calculation references of the substrate loading interval, (1) the calculation processing of the reference loading interval, (2) the interference check (interference inspection) processing of the conveyance event, and (3) the event interference check processing after shifting the substrate loading interval are explained in this order. Here, in this embodiment, the explanation is made using the example exemplified in conjunction with FIG. 2 to FIG. 5.

(1) Calculation Processing of Reference Loading Interval

In this processing, the substrate loading interval D which becomes the reference for performing the interference check of the conveyance event is calculated.

Here, this processing is substantially equal to the processing explained in conjunction with FIG. 2(a), (b), for example, and hence, the detailed explanation is omitted.

In the case of this embodiment, the substrate loading interval which becomes the reference is calculated as 180 [sec].

(2) Interference Check Processing of Conveyance Event

In this processing, a substrate treatment flow is developed for every substrate loading interval D which becomes the reference and is obtained by the above-mentioned calculation, and an interference state of the conveyance event is checked.

Here, this processing is substantially equal to the processing explained in conjunction with FIG. 3, FIG. 4 and FIG. 5, for example and hence, the detailed explanation is omitted.

In the case of the embodiment, as shown in FIG. 5, the conveyance event T5 of the first substrate and the conveyance event T1 of the fourth substrate interfere with each other.

(3) Event Interference Check Processing after Shifting Substrate Loading Interval In this processing, the loading interval of the substrate related to the subsequent event which becomes an object of the occurrence of interference is shifted, and a state of the event interference is checked again.

In the case of this embodiment, the conveyance event T5 of the first substrate and the conveyance event T1 of the fourth substrate interfere with each other and hence, with respect to the fourth substrate which is loaded subsequently, the substrate loading interval is shifted by an amount of time corresponding to the event interference (545−540=5[sec]). That is, the loading interval of the fourth substrate is set to 185[sec] which is a result obtained by adding 5[sec] to 180[sec] which is set at present.

Figure 14:
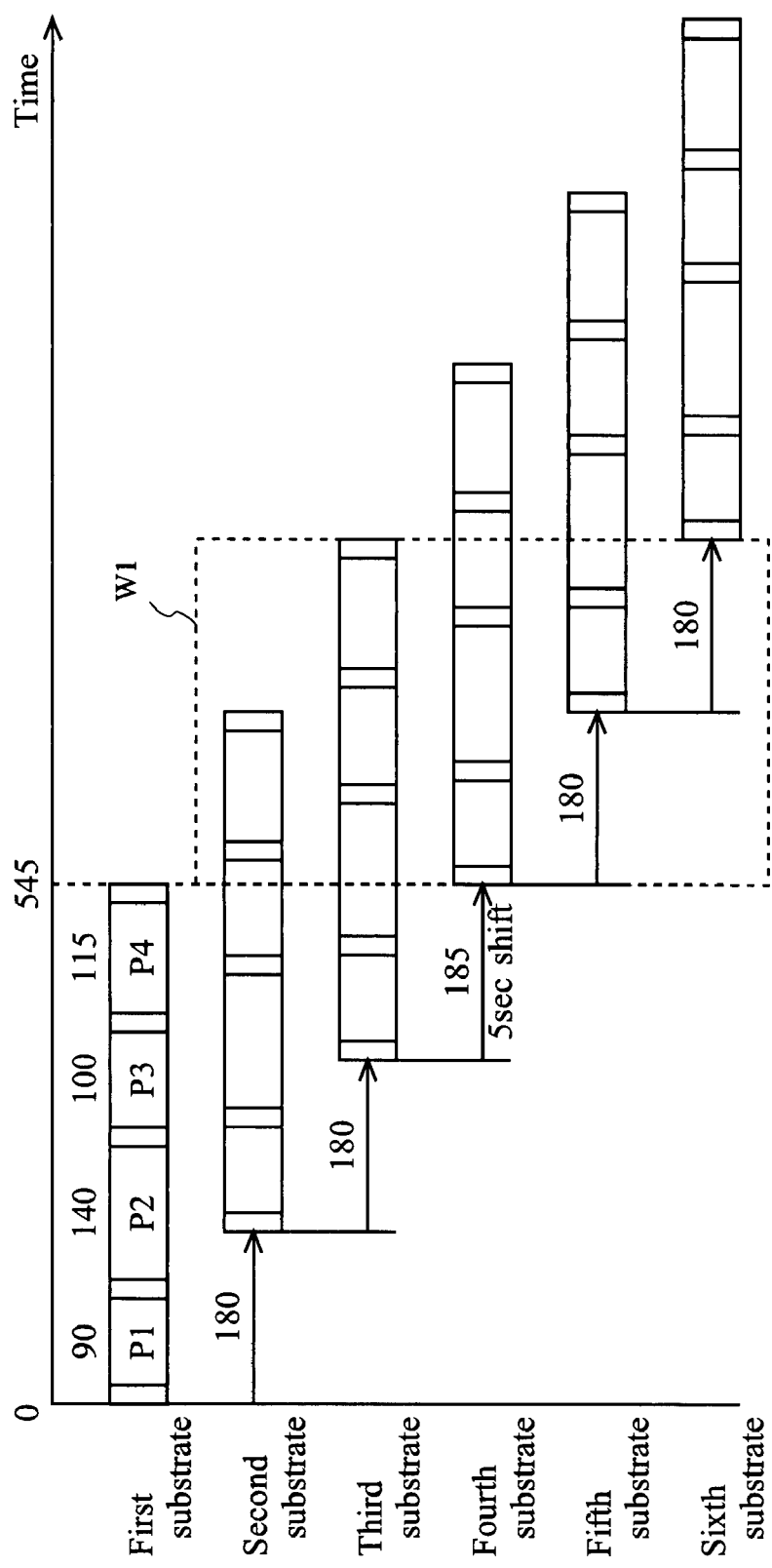
FIG. 14 is a chart showing one example of a substrate treatment flow in a developed form.

Then, the substrate treatment flow is developed as shown in FIG. 14.

In the substrate treatment flow developed here, several sheets of substrates which are treated until the substrate loading interval is shifted become objects of the substrate treatment flow. In the case of this embodiment, the shift of the loading interval occurs when the fourth substrate is loaded and hence, the processing flow of three substrates is developed.

Next, up to the completion of the treatment of the substrate in which the loading interval is shifted, the treatment flow of several substrates subsequent to the substrate is developed and it is determined whether the event interference is generated or not. If the event interference is generated, in the same manner as the above, the loading interval of the substrate which is loaded subsequently is shifted.

In the case of the embodiment, as shown in FIG. 14, up to the completion of the treatment of the fourth substrate, a state of the event interference with the subsequent substrate is checked. Here, such interference check processing can be performed in the same manner as the above-mentioned (2) interference check processing of conveyance event.

In this embodiment, interference state of the conveyance events is checked within a frame W1 shown in FIG. 14.

Here, if the event interference is generated, each time such event interference is generated, the substrate loading interval is shifted by adding an amount of time corresponding to the event interference to the loading interval of the subsequent substrate, and such a shift is repeatedly executed until the interference is no more generated.

When it is determined that no interference is generated as a result of such a conveyance interference check, the adoption of loading intervals of the respective substrates at this point of time is determined, and the treatment flow of the subsequent substrates is also developed in the same manner thus realizing the conveyance flow which does not generate the event interference.

In the case of this embodiment, the complete elimination of the interference is realized among the substrate treatment flow by setting the substrate loading interval to 185[sec] with respect to the (3p+1)th substrate and 180[sec] with respect to the substrate other than (3p+1)th substrate, wherein p is an arbitrary natural number.

Figure 15:
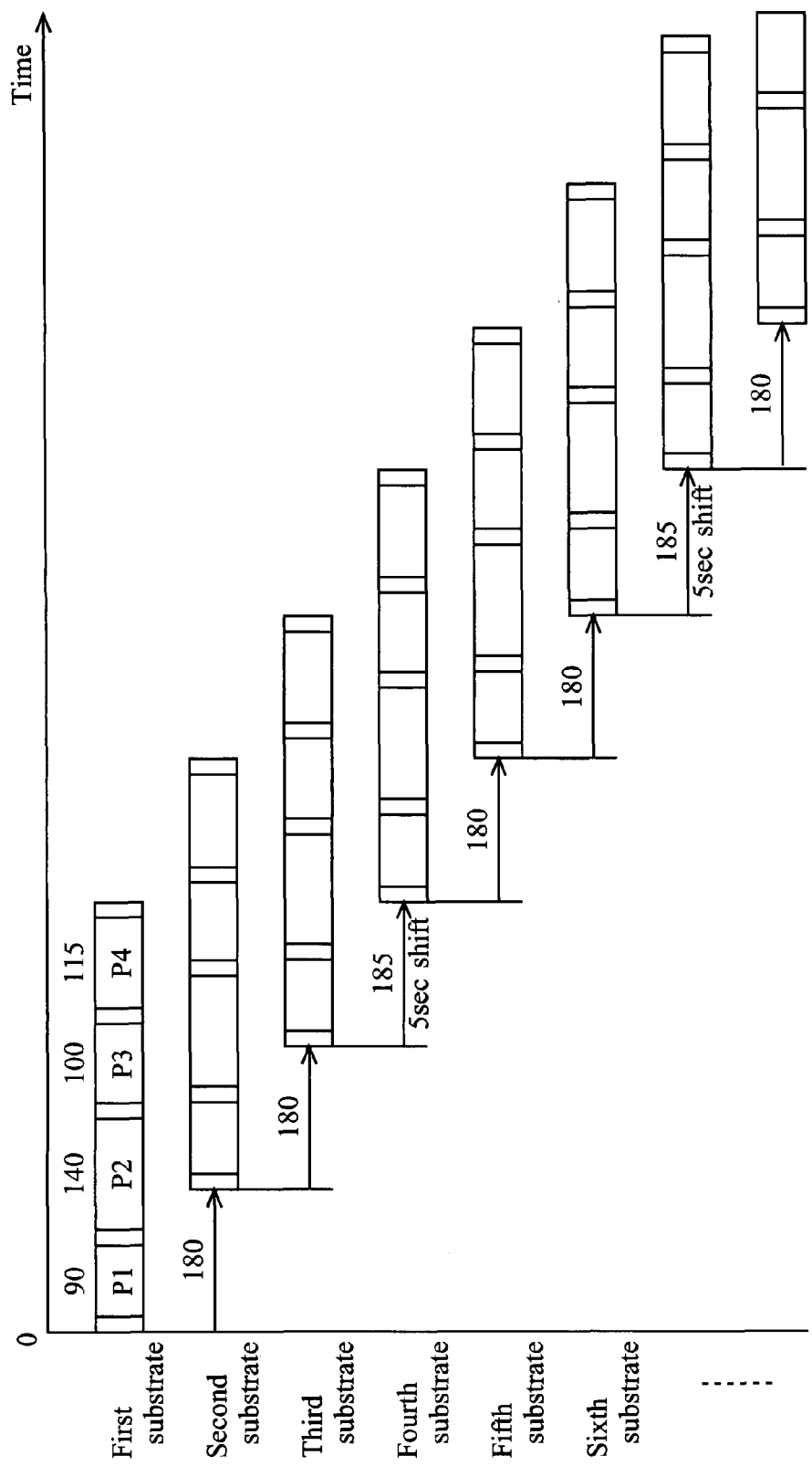
FIG. 15 is a chart showing one example of a substrate treatment flow in a developed form.

FIG. 15 is an example of development of the substrate treatment flow when such proper substrate loading intervals are set.

As described above, the substrate treatment apparatus of this embodiment includes the conveyance chamber 5 which mounts one substrate conveyance device (the transfer machine in this embodiment) 11, two or more treatment chambers 6 to 9 which are provided for performing the heat treatment and the formation of extremely thin films, and the load-locking chambers 4, 10 provided for performing the substitution of atmosphere between the atmospheric-pressure atmosphere and the atmosphere of the conveyance chamber 5, wherein by optimizing the substrate loading intervals and the delay times such that the interference of the same event attributed to the treatment events and the conveyance events of the treatment chambers 6 to 9 is not generated, the substrate loading intervals of the respective treatment chambers 6 to 9 are delayed by arbitrary times for every fixed cycle and hence, it is possible to realize the conveyance control which is free from extra substrate conveyance standby times in the treatment chambers 6 to 9.

Accordingly, in the substrate treatment apparatus of this embodiment, by optimizing the loading intervals between the substrates, it is possible to realize the conveyance control which eliminates the stagnancy of the substrates and suppresses the change of the loading interval between the substrates to a minimum value.

In this manner, according to this embodiment, in the continuous conveyance control in which the respective treatment times in the plurality of treatment chambers 6 to 9 differ from each other, it is possible to realize the conveyance control which can eliminates the stagnancy of the substrate in the treatment chambers 6 to 9 and can set the substrate loading intervals to the respective treatment chambers 6 to 9 to a fixed value as much as possible and hence, heat histories between the substrates can be made uniform so as not to generate extra thermal loads to the respective substrates thus enhancing the reproducibility and the reliability of the substrate performance.

Further, various improvements may be made without departing from the gist of the technical concept of this embodiment.

Here, the constitution of the substrate treatment apparatus and the like according to the invention is not always limited to the above-mentioned constitution and various constitutions may be adopted. Further, the invention can also provide, for example, a method or a system which executes the treatment according to the invention, a program for realizing such a method or a system, and a recording medium which records such a program. Further, the invention also can provide various devices and systems.

A technical field to which the invention is applicable is not always limited to the above-mentioned technical fields, and the invention is applicable to the various technical fields.

Further, with respect to various processing which are performed in the substrate treatment apparatus according to the invention, in a hardware resource which includes a processor, a memory and the like, for example, the processor may control these processing by executing a control program stored in a ROM (Read Only Memory), or respective functional means for executing the processing may be constituted as hardware circuits which are independent from each other, for example.

Further, the invention may also be grasped as a recording medium which can be read by a computer such as a floppy (registered trade mark) disc, a CD (Compact Disc)-ROM or the like which stores the above-mentioned control program or the program (per se), and the processing according the invention can be performed by inputting the control program to the computer from the recording medium and by allowing the processor to execute the control program.

Here, an example of a substrate conveyance control which is a comparison example with respect to the invention is described.

Figure 16:
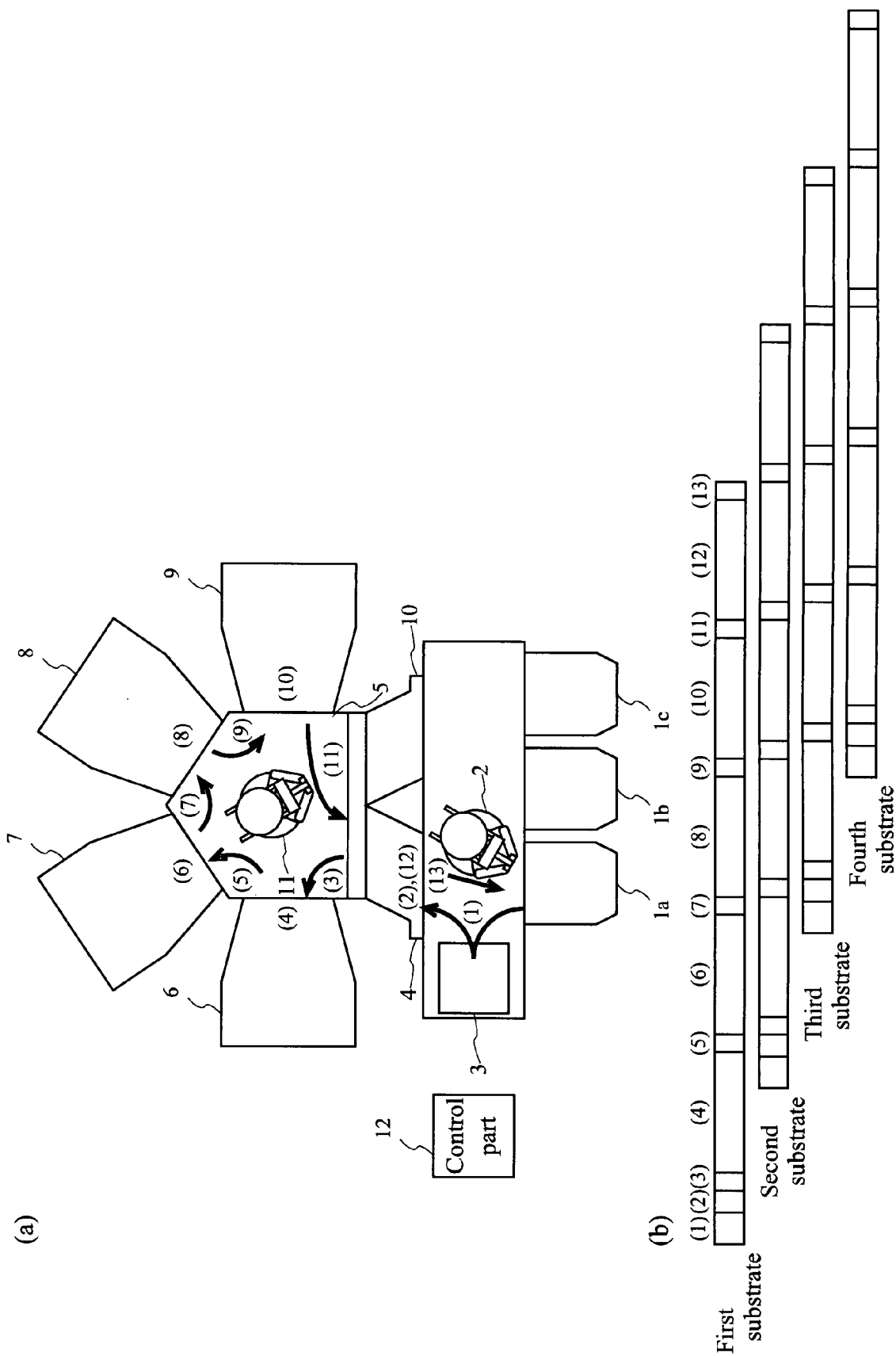
FIG. 16(a) is a view showing one example of a flow of the substrate conveyance and FIG. 16(b) is a chart which shows one example of the treatment history of the substrate as an event timing chart.

FIG. 17(*a*) (*b*) show an example of an event timing chart when a plurality of substrates is treated. Here, in the timing chart of this example, as parts which are particularly relevant to the invention, only parts of the vacuum conveyance system (parts corresponding to the treatments (3) to (11) shown in FIG. 16) are indicated. Further, symbols P1, P2, P3, P4 respectively indicate the treatments or the treatment times of four respective treatment chambers 6, 7, 8, 9 which differ from each other. Further, as the conveyance times (hatched portions in the drawing), a maximum time required for the conveyance is indicated.

FIG. 17(*a*) shows one example of a free flow method.

In this method, the sequence is executed in order of determinations of the completion of events such as the completions of the treatments in the treatment chambers 6 to 9 and the completion of the substrate conveyance so as to advance the respective events. Further, only the priority when the determinations are performed simultaneously is defined and the designation of the conveyance order is not particularly performed. As the priority, for example, information "Priority is assigned to unloading with respect to loading and unloading" is set.

However, in this method when the treatment times in the respective treatment chambers 6 to 9 differ from each other, the loading intervals to the treatment chambers 6 to 9 are changed and, at the same time, with respect to the substrates with short treatment times, even after the predetermined treatment are finished in the treatment chambers 6 to 9, the substrate cannot be transferred to the next conveyance event due to other rate-determining step and, eventually, unintended irregular stagnancy of the substrate occurs in the inside of the treatment chambers 6 to 9. That is, due to the occurrence of the change of the loading intervals or the conveyance standby at the time of unloading the substrate, the stagnancy of the substrate in the treatment chamber is generated. Further, the loading interval and the substrate stagnancy time in the chamber are irregular for every substrate and hence, the reproducibility of the substrate performance in the step which is subject to the severe heat treatment is deteriorated.

FIG. 17(*b*) shows one example of a fixed tact method.

In this method, in all conveyances, the conveyance sequence is executed as a time in which start timing is determined. Further, the step in which the optimum rate determination is obtained based on the maximum treatment time and the conveyance time of the treatment chambers 6 to 9 is set as the loading interval. For example, by optimizing all substrate conveyance operations in conformity with the longest treatment time, it is possible to suppress the changes of the loading intervals or the irregularities of stagnancy times in the treatment chambers 6 to 9. To be more specific, the loading interval of the substrate corresponds to (substrate loading time+maximum loading time+substrate unloading time), and time monitoring is performed by a tact control at predetermined timing corresponding to the loading interval (timing indicated by an arrow in the drawing). Due to such a control, the change of the loading interval or the irregularities of the treatment chamber stagnancy time is eliminated and hence, the priority among the substrates disappears.

However, in this method, in view of the characteristic of the method which sets the loading interval of all substrates to the fixed value, on the premise that the treatment times in the respective treatment chambers 6, 9 differ from each other, stagnancy of the substrate in the treatment chambers 6 to 9 is unavoidable and hence, extra heat histories are generated on the substrates and, at the same time, it is difficult to take the correlation with the single film performance.

Here, it is considered that the above-mentioned change of the loading interval and the stagnancy of the substrate in the treatment chamber adversely influence the quality of the substrate sometimes and hence, as an example of a practice, it may be possible to use either one of the substrate conveyance control methods shown in FIG. 17(*a*), (*b*) by taking the degree of influence to the quality of the substrate into consideration.

The adverse influence which is brought about when the substrate loading interval to the treatment chambers 6 to 9 becomes irregular appears, for example, as irregularities in film thickness of approximately 1 to 2% in a thermal CVD (Chemical Vapor Deposition) apparatus or the like. In the thermal CVD apparatus, a reaction gas is adhered to a temperature sensor and hence, it is difficult to directly monitor and control a temperature of the substrate whereby a temperature of a heating body which heats the substrate is indirectly monitored and controlled in many cases. Accordingly, even when the temperature of the heating body is always maintained at a fixed temperature, a stable temperature of the whole treatment chamber differs depending on a substrate loading cycle and hence, the substrate performance is influenced more or less. That is, when the substrate loading cycle is a short cycle, the temperature in the furnace is lowered, while when the substrate loading cycle is a long cycle, the temperature in the furnace is elevated and hence, a temperature recovery time at an initial stage of loading the substrate is changed thus changing the property of the film.

With respect to the influence which is brought about by the stagnancy of the substrate in the treatment chamber, for example, due to the unintended stagnancy of the substrate, the heat history to the substrate is increased compared to the usual treatment and hence, there exists a possibility that not only steps in the treatment device but also the quality of the extremely thin films which are formed up to the step in the treatment device is deteriorated.

INDUSTRIAL APPLICABILITY

As has been explained above, the substrate treatment apparatus and the like according to the invention includes the substrate conveyance chamber which has the substrate conveyance device, the plurality of treatment chambers in which the treatment time of at least one treatment chamber differs from treatment times of other treatment chambers and the respective treatment chambers are communicated with the conveyance chamber, and the control part which controls the conveyance operation of the substrate conveyance device by setting treatment schedules of the substrates, wherein in sequentially treating a plurality of substrates by the treatment chambers based on the preset same treatment schedule, the control part, using the time corresponding to the sum of the treatment time of the treatment chamber having the longest treatment time out of the treatment chambers predetermined during the treatment schedule and conveyance times before and after the treatment time with respect to the treatment chamber as the reference substrate loading interval, sets the substrate loading interval of respective substrates to the firstly loaded treatment chamber. Accordingly, it is possible to set the loading interval of the substrate to the treatment chamber to the fixed value and to prevent the stagnancy of the substrate in the treatment chamber.

The invention claimed is:

1. A manufacturing method of a semiconductor device by using a substrate treatment apparatus which includes a substrate conveyance chamber having a substrate conveyance device, a plurality of treatment chambers having respective treatment times for treating each of a plurality of substrates, wherein a treatment time of at least one treatment chamber differs from the respective treatment times of the other treatment chambers, and wherein the treatment chambers are communicated with the conveyance chamber, and a control part which controls a conveyance operation of the substrate conveyance device by setting treatment schedules of the substrates, and which treats each of the substrates sequentially in the treatment chambers based on a preset same treatment schedule, the method comprising:

determining a substrate loading interval based on a reference substrate loading interval, wherein the reference substrate loading interval is a time corresponding to a sum of (i) a longest treatment time of the respective treatment times of the treatment chambers, and (ii) conveyance times during which each substrate is to be conveyed to and conveyed from the treatment chamber having the longest treatment time, wherein said determining of the substrate loading interval includes executing a first process which sets the reference substrate loading interval as an initial value of the substrate loading interval, executing a second process which develops the treatment schedules of the substrates with time, executing a third process which determines an interference state of the substrate conveyance device among the developed treatment schedules, and executing a fourth process which sets an interval which is obtained by adding a predetermined interval to a currently set substrate loading interval as a new substrate loading interval when an interference of the substrate conveyance device occurs, wherein said executing of the second, third and fourth processes are sequentially repeated until the interference of the substrate conveyance devices is eliminated;

conveying a first one of the substrates to a first one of the treatment chambers set in the preset same treatment schedule; and conveying successive ones of the substrates to the first treatment chamber based on the substrate loading interval.

2. A manufacturing method according to claim 1, wherein a treatment schedule in which one treatment is performed in each of the treatment chambers is used as the preset same treatment schedule.

3. A manufacturing method according to claim 1, wherein a treatment schedule in which a plurality of treatments is performed in at least one of the treatment chambers is used as the preset same treatment schedule.

4. A manufacturing method according to claim 1, wherein the control part sets the substrate loading intervals of the substrates without changing the preset same treatment schedule.

5. A manufacturing method according to claim 4, wherein a schedule of a series of treatments which include a conveyance treatment by the substrate conveyance device and treatments in the respective treatment chambers in a period extending from loading of one substrate into the first treatment chamber to unloading of the substrate from a last one of the treatment chambers is used as the preset same treatment schedule.

6. A manufacturing method according to claim 1, wherein an interval of one second is used as the predetermined interval which is added to the currently set substrate loading interval in said executing of the fourth process.

7. A manufacturing method according to claim 1, wherein an interval set by a resolution of a control system which controls the conveyance operation is used as the predetermined interval which is added to the currently set substrate loading interval in said executing of the fourth process.

* * * * *